(12) United States Patent
Ellis

(10) Patent No.: US 6,324,485 B1
(45) Date of Patent: Nov. 27, 2001

(54) APPLICATION SPECIFIC AUTOMATED TEST EQUIPMENT SYSTEM FOR TESTING INTEGRATED CIRCUIT DEVICES IN A NATIVE ENVIRONMENT

(75) Inventor: James M. Ellis, Sacramento, CA (US)

(73) Assignee: NewMillennia Solutions, Inc., Santa Clara, CA (US)

(*) Notice: Subject to any disclaimer, the term of this patent is extended or adjusted under 35 U.S.C. 154(b) by 0 days.

(21) Appl. No.: 09/238,649

(22) Filed: Jan. 26, 1999

(51) Int. Cl.$^7$ .................................................. G01R 31/28
(52) U.S. Cl. ...................... 702/117; 702/108; 702/109; 702/110; 702/115
(58) Field of Search ..................... 702/108–127; 714/731, 726; 324/537, 750, 755, 763, 768

(56) References Cited

U.S. PATENT DOCUMENTS

| | | | |
|---|---|---|---|
| 5,131,272 | | 7/1992 | Minei et al. ............................. 73/431 |
| 5,357,195 | * | 10/1994 | Gasbarro et al. .................. 324/158.1 |
| 5,381,421 | * | 1/1995 | Dickel et al. ............................ 371/27 |
| 5,497,379 | | 3/1996 | Whetsel ............................... 371/22.3 |
| 5,592,632 | | 1/1997 | Leung et al. .......................... 395/306 |
| 5,613,077 | | 3/1997 | Leung et al. .......................... 395/306 |
| 5,666,480 | | 9/1997 | Leung et al. .......................... 395/180 |
| 5,701,309 | | 12/1997 | Gearhardt et al. ................... 371/25.1 |
| 5,748,916 | | 5/1998 | Conway et al. ...................... 395/287 |
| 5,794,175 | | 8/1998 | Conner ................................. 702/119 |
| 5,796,746 | * | 8/1998 | Farnworth et al. .................. 371/21.1 |
| 5,825,786 | | 10/1998 | Burns ................................. 371/167.1 |
| 5,844,913 | * | 12/1998 | Hassoun et al. ..................... 371/21.1 |
| 5,845,234 | | 12/1998 | Testa et al. ........................... 702/119 |
| 5,931,962 | * | 8/1999 | Dang .................................... 714/317 |
| 5,948,115 | * | 9/1999 | Dinteman ............................. 714/738 |
| 6,099,161 | * | 8/2000 | Furlan ..................................... 371/27 |
| 6,105,157 | * | 8/2000 | Miller ................................... 714/744 |
| 6,125,461 | * | 9/2000 | Huisman et al. ..................... 714/724 |
| 6,151,356 | * | 11/2000 | Spagnoletti et al. ................. 375/226 |
| 6,167,001 | * | 12/2000 | Wu ....................................... 368/113 |

FOREIGN PATENT DOCUMENTS

PCT/US93/07262  8/1993 (WO) ............................ G11C/29/00

OTHER PUBLICATIONS

ATE Suppliers Rise to Test Systems on a Chip, Electronic News (1991), v43, n2194, p6 (3), Nov. 17, 1997.

* cited by examiner

Primary Examiner—Marc S. Hoff
Assistant Examiner—Carol S. Tsai
(74) Attorney, Agent, or Firm—Dergosits & Noah LLP

(57) ABSTRACT

An application specific automated test equipment system for source synchronous bus interface devices is described. A native interface board is provided to interface an automated test unit and a device under test. The native interface board is configured with devices selected to recreate a native environment of the device under test. A first clock drives the devices on the native interface board. A second clock drives the device under test. The second clock signal is derived from the first clock signal to form a substitute clock signal that can be adjusted in relation to the first clock signal. Input and output timing relationships of the device under test are determined by altering the arrival time of the substitute clock at the device under test with respect to the timing of the first clock signal.

25 Claims, 15 Drawing Sheets

APPLICATION SPECIFIC AUTOMATED TEST EQUIPMENT SYSTEM FOR TESTING INTEGRATED CIRCUIT DEVICES IN A NATIVE ENVIRONMENT

CROSS-REFERENCE TO RELATED APPLICATION

The present application is related to the following co-pending U.S. patent application: U.S. patent application entitled, "Method and Apparatus for In-Circuit Testing of Source Synchronous Bus Interface Devices", having application Ser. No. 09/239,044, and filed on Jan. 26,1999, and which is assigned to NewMillennia Solutions, LLC.

FIELD OF THE INVENTION

The present invention relates generally to automated test equipment, and more specifically to an apparatus for testing source synchronous bus interface devices.

BACKGROUND OF THE INVENTION

Automated testing is a critical step in the production of integrated circuit (IC) devices. Large scale IC manufacturers rely on highly sophisticated Automated Test Equipment (ATE) systems to test their devices, and the cost of these tests often comprises a significant percentage of the device cost.

FIG. 1A illustrates the main components of a typical present ATE system. The ATE system 100 includes an ATE unit 102 connected to a control computer 104. Control computer 104 provides a user interface that accepts input commands to the ATE unit 102 and outputs test results and other information. In system 100, a device under test (DUT) 108 is mounted on an adapter (or load) board 106. Adapter board 106 provides the physical and electrical interface between DUT 108 and ATE unit 102. The ATE unit 102 tests the DUT 108 by driving stimulus signals into the DUT and receiving responsive signals from the DUT. The correlation between these input and output signals is processed by the ATE unit to determine whether the DUT passed or failed the test.

The stimulus signals generated by the ATE unit 102 comprise data signals and clock signals to synchronize the stimulus input. The effectiveness of the test depends on the accurate placement of these signals relative to one another. For example, several different signals, such as, clock, data, and enable signals must be coordinated and triggered at appropriate times to ensure that meaningful data is acquired during the test process. Inaccuracy of clock and data signal edge placement will result in false test results. As the operating speed of devices to be tested increases, the margins of error for edge placement accuracy decreases.

The increasing performance of each new generation of IC's thus places greater demands on existing ATE systems. As a result, ATE vendors are increasingly forced to redesign or retrofit existing ATE systems to accommodate newer generation high speed devices. The adaptation of existing ATE systems to test new high speed devices, such as through parallel processing or increased software processing, leads to systems that are both expensive and inadequate for long-term test solutions.

A significant development in the design of new generation IC devices is the advent of high speed source synchronous bus interface devices. A notable example of such a device interface specification is the RAMBUST™ channel, which was developed to overcome the processor-to-memory performance gap resulting from the inability of memory devices to keep pace with the performance increases of microprocessors. RAMBUS is a trademark of Rambus, Inc. of Mountain View, Calif. The Direct RAMBUS Channel is a high performance device-to-device interface that enhances input/output transfers between devices. Current RAMBUS devices are capable of transferring data at up to 800 MHz, in contrast to the 100 to 200 MHz transfer rates of current DRAM (Dynamic Random Access Memory) devices.

The RAMBUS channel is a source synchronous bus interface in which a clock signal is transmitted alongside data to create a point-to-point bus interface, and all commands and data are referenced to clock edges. This type of interface more easily creates and maintains accurate clock-to-data relationships among devices, as opposed to common clock distribution methods where the clock-to-data relationships must be maintained by managing the skew of clock distribution trees. For a source synchronous bus interface, data exchanges originate from a source device, and terminate at a destination device. The proper clock-to-data timing relationship is established by the source device. The destination device receives both the clock and data, using the clock to properly capture the data sequence. Because of the high transfer rates, clock-to-data skew must be minimized to ensure that data transfers are properly synchronized.

Present known ATE systems are generally unable to accurately and inexpensively test devices developed for high performance interfaces such as the Direct RAMBUS Channel. When applied to Rambus Signaling Level input/output timing, the edge placement accuracy of an ATE system constitutes a significant portion of the specification that is to be measured. In general, edge placement accuracy in the context of ATE systems refers to the placement of data edges relative to clock trigger edges, and is affected by skew and jitter of the clock signal. Assuming that an ATE system is required to exhibit edge placement accuracy of on the order of ten percent of specification, present systems that are at best capable of edge placement accuracy of +/−50 picoseconds would not be accurate enough to test RAMBUS devices that are capable of attaining 800 MHz transfer rates.

FIG. 1B illustrates an interface between a memory controller and RAMBUS memory devices for a single-channel RAMBUS system. In circuit 150, a memory controller 152 is coupled to three RAMBUS in-line memory modules (RIMMs). Each RIMM module 154, 156, and 158 contains a number (typically four or eight) of RAMBUS DRAM (RDRAM) devices 166. Data signals 170 and address/control signals 172 are transmitted from the memory controller to the RIMM modules. The data and address/control signals are terminated to a termination voltage $V_{term}$ 162 through termination resistors 164. Clock 160 generates a clock signal with a phase alignment required by the memory controller 152. In a RAMBUS channel, data is transferred on both edges of the clock, thus a 400 MHz clock signal results in an 800 MHz transfer rate.

The clock loop begins at the termination end of the channel and propagates to the controller end as ClockTo-Master (CTM) 176; it then loops back from the memory controller 152 as ClockFromMaster (CFM) 174 to the RIMM modules, and terminates through termination resistor 164. The clock and data signals travel in parallel to minimize skew, and their electrical lengths are equal to maintain the proper clock-to-data timing relationship at the destination device. Data is transmitted from the RIMMs to memory controller 152 synchronously with the CTM signal 176, and memory controller 152 sends data to the RIMMs synchronously with the CFM signal 174.

Present known ATE systems, such as ATE system 100 of FIG. 1A, exhibit several disadvantages when testing high speed source synchronous bus interface devices, such as RAMBUS RDRAMs. These systems are typically designed as general purpose systems that are intended to test a variety of different devices. The hardware interface between the DUT and test unit is often simplified to enhance this flexibility. Such systems rely on extensive software programming and user expertise to test a fill range of device types. Because such test systems are designed for general purpose use, the DUT is tested in an artificial environment in which all signals driving the DUT are derived from the ATE unit itself.

Although present ATE systems may attempt to simulate the operating conditions of a DUT, they are unable to accurately recreate the native environment of the DUT. Therefore, present ATE test environments typically do not accurately reflect the electrical and timing conditions of the native environment of the device, and thus do not always accurately account for the stresses encountered during normal operation.

Furthermore, present ATE systems typically perform pass/fail or marginality tests of a device only in comparison with a given specification. Such tests thus measure the performance of a device under artificial conditions and in reference to an absolute standard. Present ATE systems do not measure the margin of error for a device with regard to its tolerance under varying operational conditions that may be present in its native environment.

An additional disadvantage of present known ATE systems is that all data stimulus signals are driven from a clock circuit that is typically located a significant distance from the device under test. As a result, propagation delays and degradation of the clock signal due to noise limit the accuracy of these systems when testing high speed devices. Moreover, such ATE systems may also include multiple independent timing generators that further complicates distribution of clock signals to the DUT and increases the possibility of clock-data skew at the DUT.

SUMMARY AND OBJECTS OF THE INVENTION

It is an object of embodiments of the present invention to provide an automated test equipment system that is capable of testing different types of IC devices in their native environments.

It is a further object of embodiments of the invention to provide an automated test equipment system that features a high degree of edge placement accuracy for testing high performance IC devices.

It is yet a further object of embodiments of the invention to provide an automated test equipment system that tests the marginality of an IC device when operating in its native environment.

It is also an object of embodiments of the present invention to provide a cost-effective method of testing high performance source synchronous bus interface devices.

An application specific automated test equipment system for testing integrated circuit devices is described. In one embodiment of the present invention, the automated test equipment system includes an interface board that recreates the native motherboard environment of the device under test. Components on the interface board are clocked by a resident clock circuit. A timing control circuit coupled to the resident clock source generates a substitute clock signal that is used to clock the device under test. The timing control circuit adjusts the timing characteristics of the substitute clock signal relative to the resident clock signal. During testing, a timing characteristic of the substitute clock is adjusted to determine the margin of error in the input and output signal timings of the device under test.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE INVENTION

An application specific automated test equipment system for testing integrated circuit devices in their native environment is described. In the following description, for purposes of explanation, numerous specific details are set forth in order to provide a thorough understanding of the present invention. It will be evident, however, to one of ordinary skill in the art, that the present invention may be practiced without these specific details. In other instances, well-known structures and devices are shown in block diagram form to facilitate explanation. The description of preferred embodiments is not intended to limit the scope of the claims appended hereto.

Figure 2:
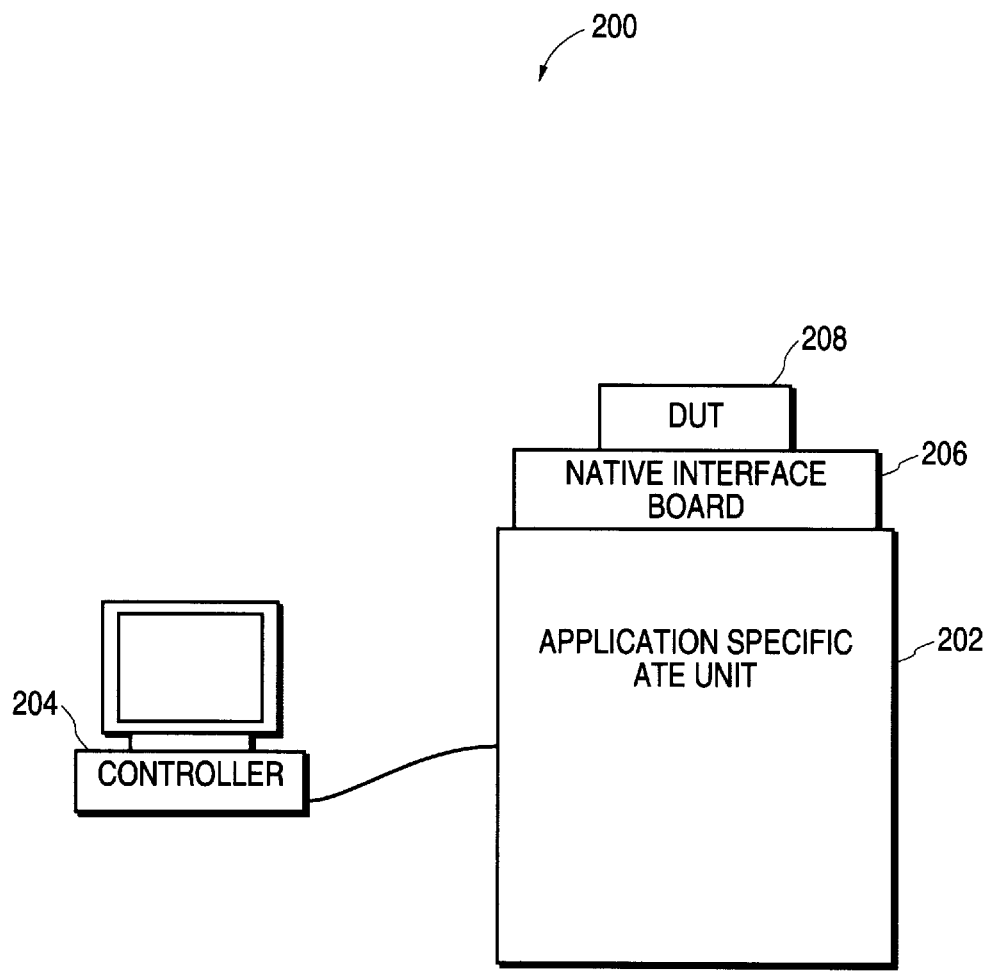
FIG. 2 illustrates an application specific automated test equipment system incorporating a native environment interface board, according to one embodiment of the present invention.

FIG. 2 illustrates an application specific automated test equipment system, according to one embodiment of the present invention. The ATE system 200 of FIG. 2 includes an application specific ATE unit 202 connected to a control computer 204. Control computer 204 provides a user interface that receives input commands to the test unit 202 and outputs test results and other information. For one embodiment, control computer 204 is a personal computer or workstation class computer. In system 200, a device under test (DUT) 208 is mounted on a native interface board 206. Native interface board 206 provides the physical and electrical interface between the DUT 208 and the application specific ATE unit 202.

In general operation, one or more test routines is loaded into resident memory on the native interface board 206. Control computer 204 is used to initiate the testing of the DUT using these test routines. The test routines cause the application specific ATE unit 202 to drive stimulus signals into the DUT 208 and receive responsive signals from the DUT 208. The correlation between these input and output signals is processed by ATE unit 202 to determine the pass/fail status of the DUT, as well as its marginal performance under varying operational conditions. In one embodiment of the present invention, the stimulus signals comprise signals that simulate data transfer operations as well as clock signals to synchronize the stimulus input.

Figure 1A:
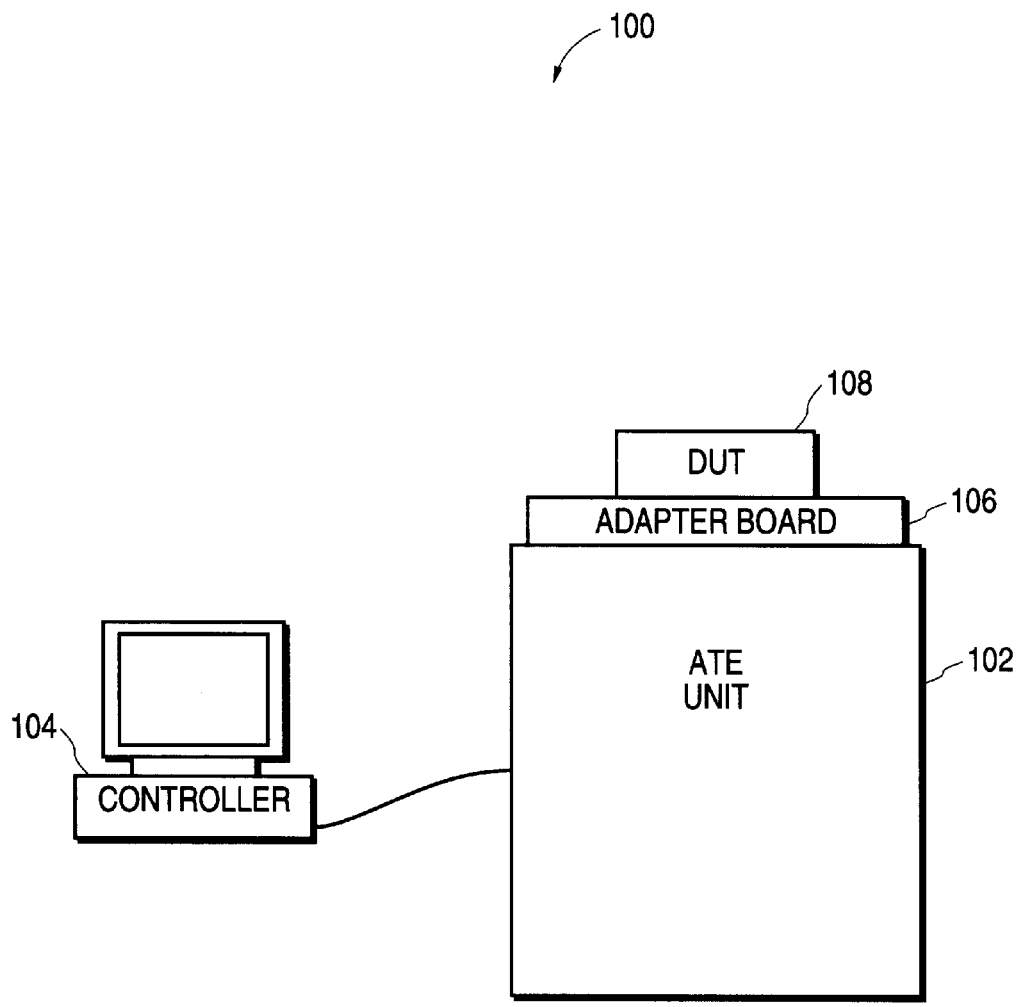
FIG. 1A illustrates a present known automated test equipment system.
Figure 1B:
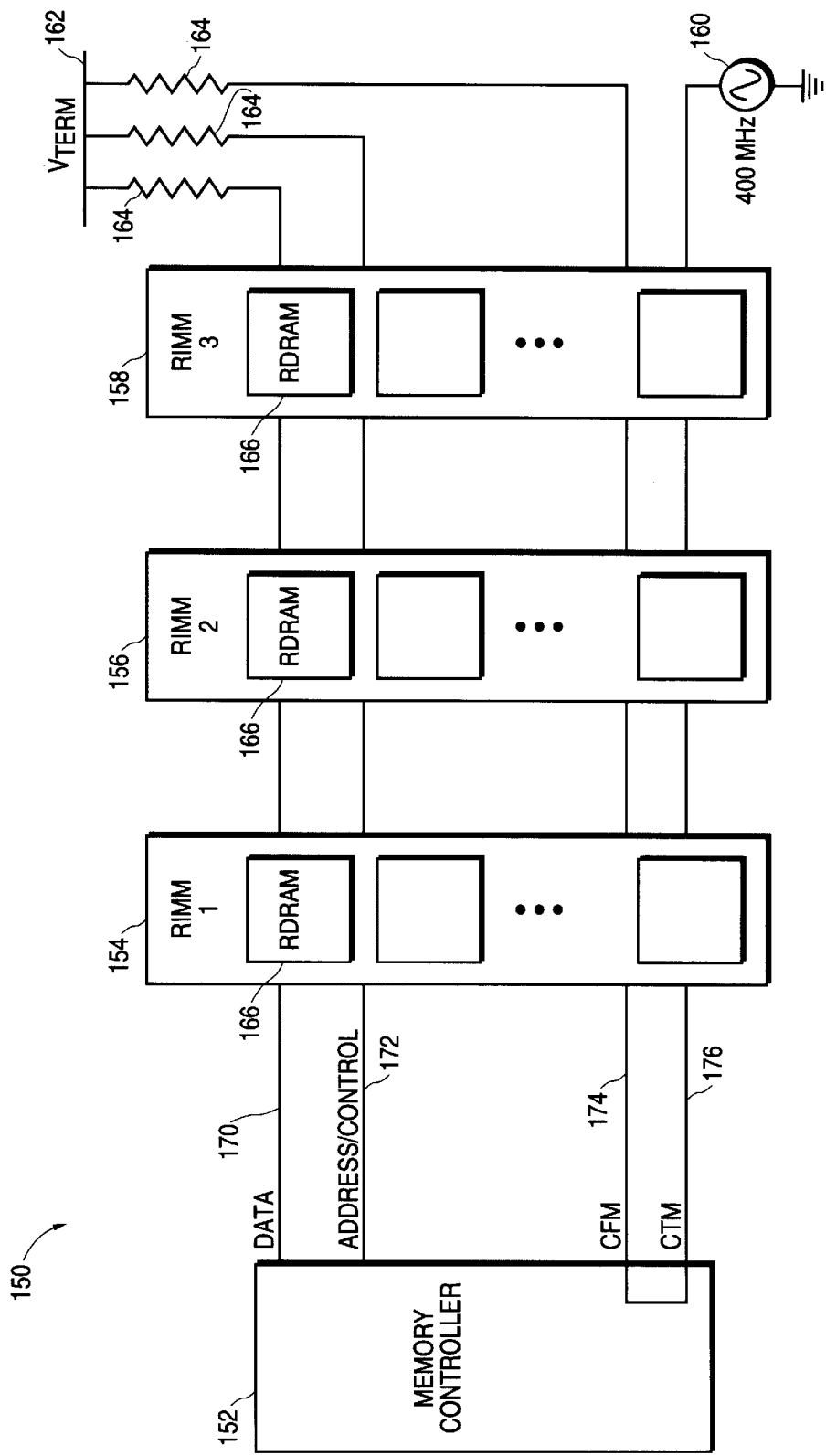
FIG. 1B illustrates memory devices coupled to a memory controller in a single channel RAMBUS system.

In one embodiment of the present invention, the native interface board 206 in ATE system 200 is a circuit board that embodies or recreates the native environment of the device under test. For example, if the DUT is a microprocessor or memory device for a personal computer, the native interface board 206 is fabricated as a motherboard for the personal computer in which the device is typically used. This contrasts markedly to typical adapter boards of present ATE systems, such as ATE system 100 of FIG. 1A, in which adapter board 106 is typically a simple board that only provides sockets for installing the DUTs and buffers to transmit and condition the data and clock signals.

Figure 3A:
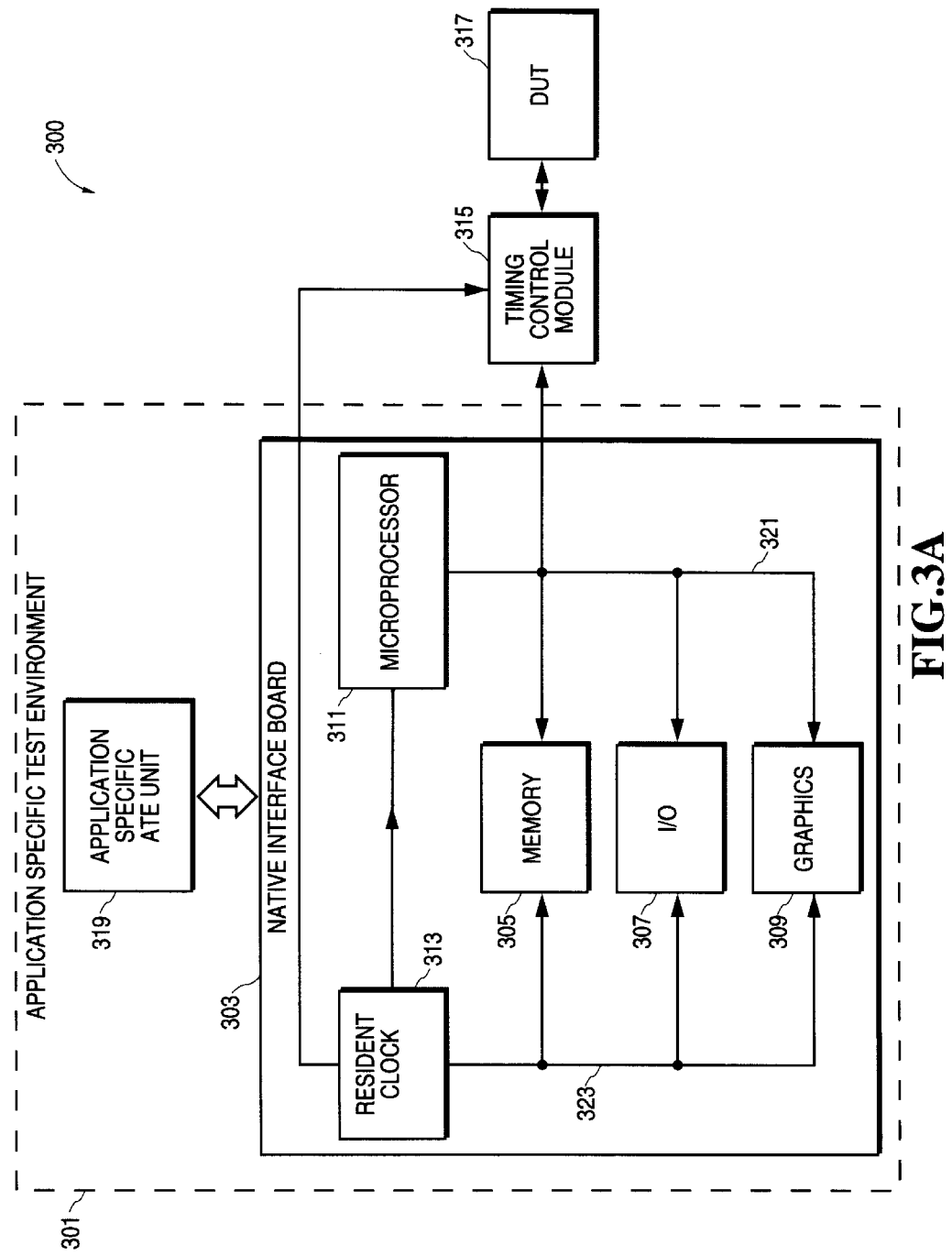
FIG. 3A is a block diagram illustrating a native interface board for an application specific automated test equipment system, according to one embodiment of the present invention.

FIG. 3A is a block diagram of a native interface board that is configured to be used with an application specific ATE system, according to one embodiment of the present invention. The composition and configuration of native interface board 303 is designed to recreate the motherboard circuitry that corresponds to the native operating environment of the DUT. For the embodiment illustrated in FIG. 3A, DUT 317 is assumed to be a device that is used in a personal computer (PC), such as a memory device or processor support chip. For this DUT, the native interface board 303 is thus designed and fabricated as a PC motherboard. Native interface board 303 contains a microprocessor 311 that is connected through processor bus 321 to memory 305, input/output (I/O) components 307, graphics components 309, and any other devices that are normally present on a native motherboard for DUT 317. A resident clock 313 provides a resident clock signal to each of the resident devices on the native interface board 303 either directly or through a clock bus 323.

The native interface board 303 is connected to an application specific ATE test unit 319 that executes test routines for DUT 317. Together, the application specific ATE unit 319 and the native interface board 303 comprise the application specific test environment 301 that is used to test DUT 317. Through the use of a native interface board that recreates the motherboard of the DUT, the DUT is effectively tested in its native operating environment, instead of in an artificial test environment as produced by present ATE systems. The use of a resident clock signal ensures that device timing characteristics of the devices on the interface board and the DUT are generated in relation to a native clock signal. This contrasts markedly to present ATE systems, in which the clock signal is generated within the ATE unit itself (e.g., test unit 102 in FIG. 1A) and is then provided externally to the DUT. For such present systems, the clock distribution scheme must be mapped between the native environment and the ATE system environment, thus generating potential clock-to-data skew error between source and test devices.

By providing a resident clock, embodiments of the present invention preserve the clock distribution schemes and timing characteristics of the native environment surrounding the DUT. This eliminates the need to map a foreign (ATE) environment onto the DUT, and reduces the introduction of abnormal timing constraints and/or skew characteristics in the testing process.

In one embodiment of the present invention, a timing control module 315 provides timing signals to DUT 317 from the native interface board 303. Timing control module 315 produces a clock signal that is derived from the resident clock 313 to drive DUT 317. Timing control module 315 also includes circuitry that allows the clock signal for the DUT to be time adjusted relative to the resident clock 313 signal. In one embodiment of the present invention, the timing control module 315 is placed in close proximity to DUT 317. Locating the timing control module close to the DUT increases the edge placement accuracy of ATE system 300 by minimizing clock-to-data skew at the DUT and signal degradation due to noise and propagation delays.

For the embodiment illustrated in FIG. 3A, the timing control module 315 can be implemented as a circuit that is separate from the native interface board 303. Alternatively, however, the timing control module 315 can be implemented as a circuit on the native interface board 303. Likewise, the DUT 317 can be coupled to the native interface board 303 and timing control module 315 through a dedicated interface mechanism (such as a riser card or ribbon cable), or simply through a socket on the native interface board 303.

Figure 3B:
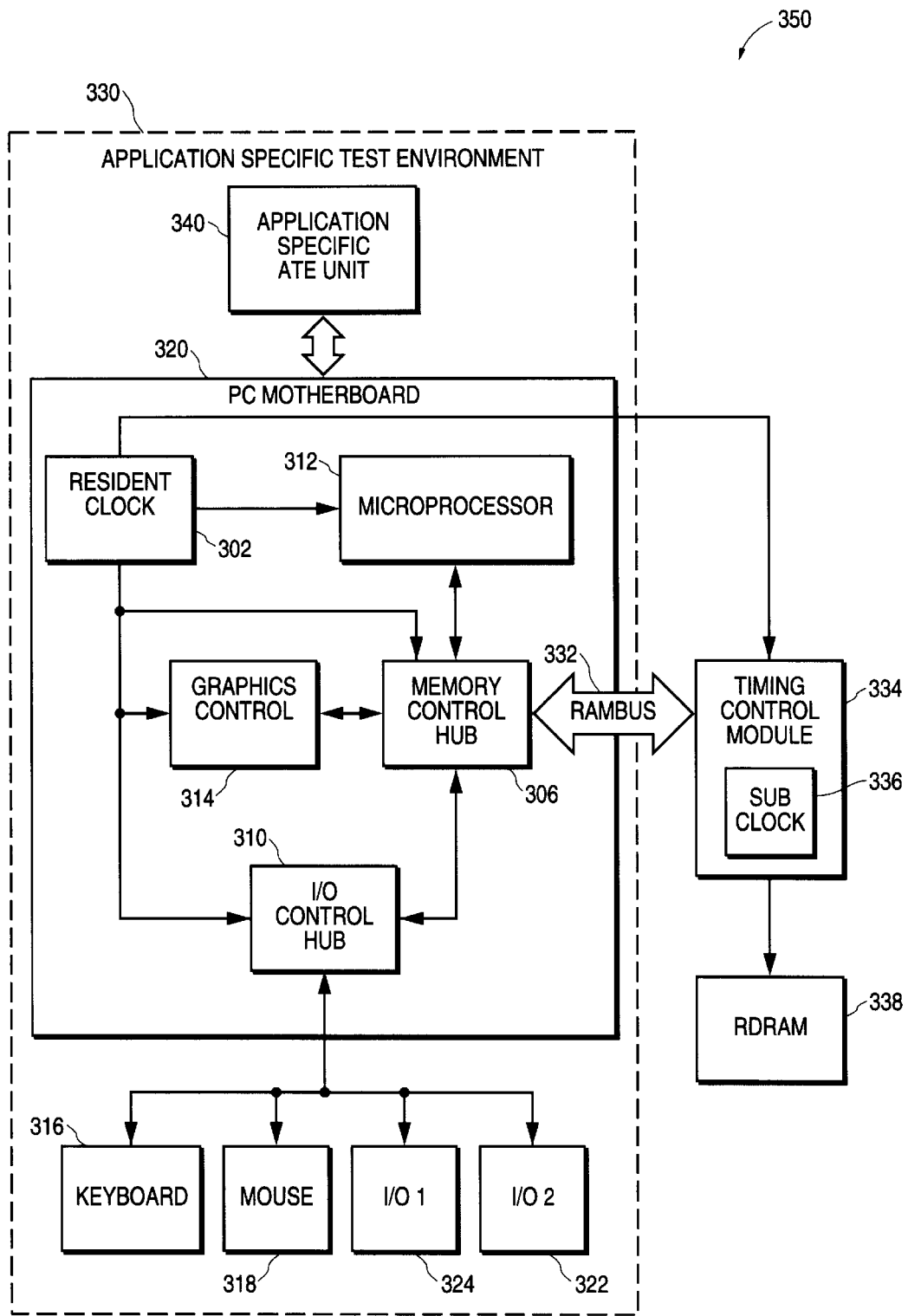
FIG. 3B is a block diagram illustrating a native interface board for an application specific automated test equipment system, according to an alternative embodiment of the present invention.

In accordance with embodiments of the present invention, the native interface board 206 in FIG. 2 can be modified to accommodate and test many different types of IC devices. FIG. 3B is a block diagram of a native interface board for use in an application specific ATE system that is configured to test a RAMBUS RDRAM device. The native operating environment for such a device is typically a motherboard of a personal computer or workstation computer. In system 350, the native interface board 320 is thus configured as a PC motherboard that accommodates RAMBUS memories.

Native interface board 320 includes a microprocessor 312 coupled to a memory control hub 306. The memory control hub 306 is coupled to the RDRAM DUT 338 through a direct RAMBUS channel 332. Also present on the native interface board 320 are one or more ancillary IC's such as a graphics control chip 314 and an I/O control hub 310. The internal circuitry coupling the devices on native interface board 320 is configured in accordance with the normal configuration of the motherboard containing RDRAM 338. To completely recreate the native environment of the RDRAM device under test, several I/O devices may be coupled to the I/O control hub 310. These include a keyboard 316, mouse 318, and other I/O devices 322 and 324. Native interface board 320 is coupled to an application specific ATE unit 340 to provide the application specific test environment 330 for RDRAM DUT 338.

The native interface board 320 also includes a resident clock 302. For the embodiment illustrated in FIG. 3B, resident clock 302 provides a clock signal to each of the devices on the native interface board 320. Resident clock 302 also provides a clock signal to a timing control module 334 that is connected to RDRAM DUT 338. Timing control module 334 includes a substitute clock circuit 336 that derives a substitute clock signal from the resident clock 302 signal and transmits this substitute clock signal to RDRAM DUT 338.

In one embodiment of the present invention, the substitute clock signal is generated by intercepting the resident clock 302 signal, and replacing it with a phase aligned version that is time adjustable. RDRAM DUT 338 receives the substitute clock signal and data. When the substitute clock signal is phase aligned with the resident clock 302 signal, the substitution of the resident clock signal is undetected by the DUT and its defined interface functions.

In one embodiment of the present invention, the substitute clock signal generated by substitute clock circuit 336 is time/phase adjustable in relation to the resident clock 302 signal. The substitute clock signal is generated by shifting the clock edge transition time (phase) of the resident clock signal and/or varying the amplitude of the resident clock 302 signal. For this embodiment, the timing control module 334 includes a delay and amplifier circuit that adjusts the phase and/or amplitude of the substitute clock 336 signal relative to the resident clock 302 signal. The timing control module 334 may also include an adjustment circuit that allows one or more other characteristics, such as duty cycle or waveform of the substitute clock 336 signal to be adjusted relative to the resident clock 302 signal.

In an alternative embodiment of the present invention, the substitute clock 336 is an independent clock circuit, and the substitute clock signal is generated independently of the resident clock signal generated by resident clock 302. The timing control module 334 adjusts timing characteristics of the substitute clock signal relative to the resident clock signal, but the substitute clock signal is not derived from the resident clock signal.

As stated above, in one embodiment of the present invention, the timing control circuit 334 includes an adjustment circuit that adjusts a characteristic of the substitute clock signal relative to the resident clock signal. This allows the clock-to-data time relationship at the DUT to be altered relative to the resident clock 302. In one embodiment, the edge timing of the substitute clock signal is delayed or advanced to change the phase of the substitute clock signal relative to the resident clock 302 signal. The bus and clock routing, as defined by the circuit design rules of the bus interface of the DUT, create a known, expected relationship at the DUT. This relationship is altered when the delay value of the substitute clock signal is adjusted. For example, it is assumed that the source device causes data to be launched at a certain particular time before the clock edge. It is also assumed that the destination device requires a minimum input setup time as per its specification. If the clock and data routing have zero skew, losses, and crosstalk, then data launched at time $T_{dvb}$ (Time Data Valid Before) before the clock edge will arrive at the destination device with the same clock to data relationship.

It is generally useful to know the clock-to-data margin of error that is present at the DUT. This allows the user to measure the tolerance or failure range of the device under test, as opposed to receiving only a pass/fail test result for the device. In one embodiment of the present invention, the phase of the substitute clock is advanced with respect to the data launch cycle such that data at the DUT arrives with an ever-decreasing setup time. This simulates the case in which $T_{dvb}$ was incorrect at the time of data launch. Eventually, the transaction will fail as incorrect data is captured because of a setup time violation at the destination device. In this manner, the setup time margin for the DUT can be determined to give a measurement of its setup tolerance. Similarly, hold time margin testing for the DUT can be accomplished by retarding the substitute clock transition time until the transaction fails at the DUT due to inadequate hold time at the input stage.

Figure 4:
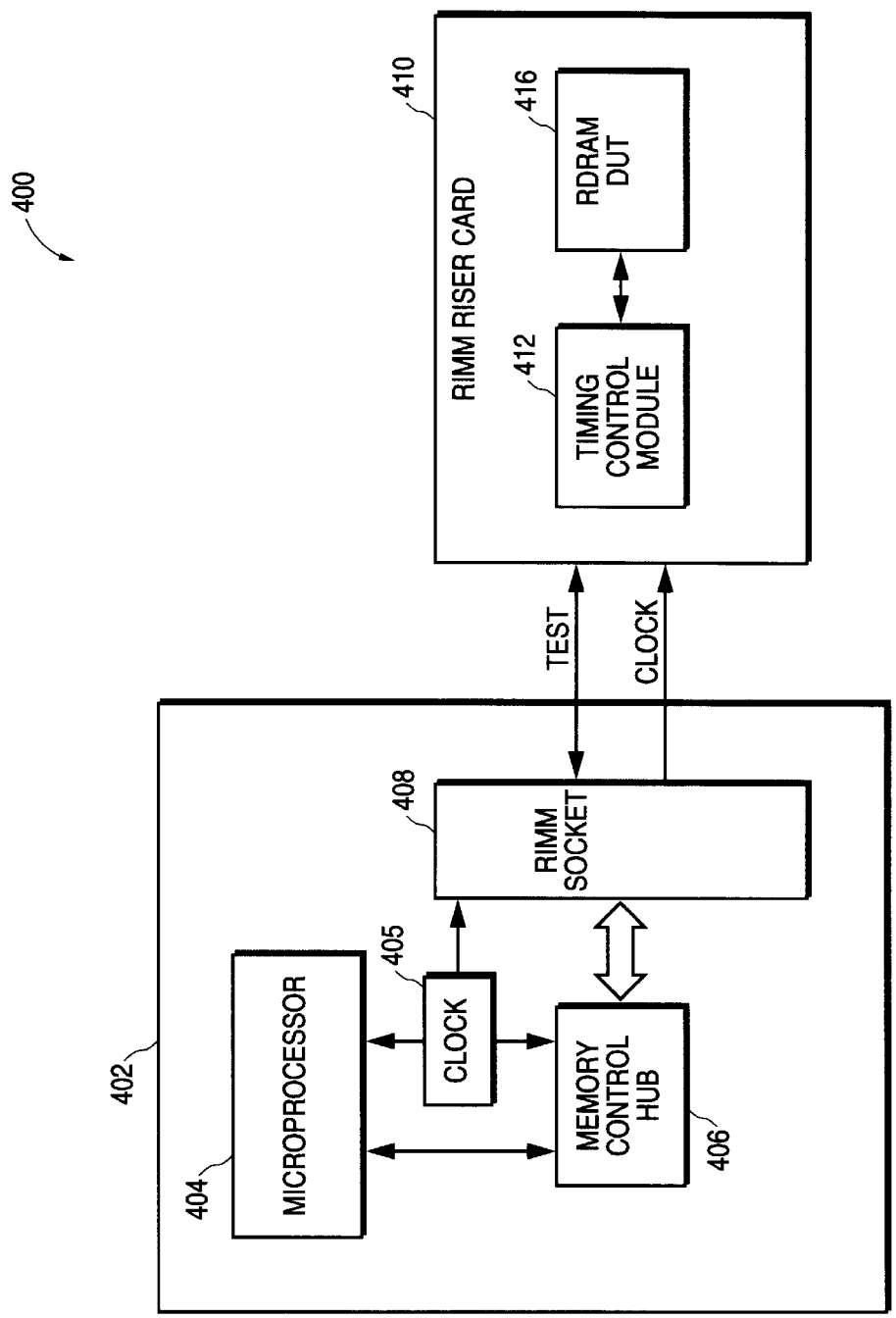
FIG. 4 illustrates the interface between a native interface board and a RAMBUS device under test, according to one embodiment of the present invention.

The substitute clock methodology described above is useful for in-system testing of RAMBUS devices. The amount of in-system channel margin that exists between a memory controller and RDRAM devices in a system is generally an important parameter to determine. FIG. 4 illustrates the physical interface between a RAMBUS DUT and a native interface board for an application specific ATE system that provides a time adjustable substitute clock, according to one embodiment of the present invention. For the embodiment illustrated in FIG. 4, the DUT is assumed to be one or more RAMBUS RDRAM devices contained on a standard RAMBUS in-line memory module (RIMM). Native interface board 402 includes microprocessor 404 coupled to memory control hub 406. Other devices that may be present on the native interface board are not shown to avoid unnecessarily obscuring the illustration. The devices on the native interface board 402 are clocked by a resident clock 405.

In one embodiment of the present invention, RAMBUS interface lines from the memory control hub 406 are connected to a RIMM socket 408 installed on the native interface board 402. A detachable RIMM riser card 410 is inserted into the RIMM socket 408. A clock signal from resident clock 405 along with test signals are transmitted through the RIMM socket 408 to the RIMM riser card 410. In one embodiment of the present invention, the RIMM riser card 410 comprises a printed circuit board (PCB) that contains signal traces to conduct RAMBUS interface signals from the memory control hub 406 to the one or more RDRAM devices under test 416 that are installed on the RIMM riser card 410.

In one embodiment of the present invention, a timing control module 412 is installed on the RIMM riser card 410 and coupled between the native interface board 402 and the RDRAM devices under test 416. The timing control module 412 provides a substitute clock signal to the RDRAM devices under test 416. In one embodiment of the present invention, the substitute clock signal provided by timing control module 412 is derived from the resident clock 405 on the native interface board 402. Alternatively, the substitute clock signal provided by the timing control module 412 is generated independently of the resident clock 405 signal.

The timing control module 412 includes an adjustment circuit that adjusts one or more characteristics of the substitute clock circuit relative to the resident clock signal. In one embodiment of the present invention, the adjustment circuit includes a delay circuit to adjust the phase of the substitute clock signal and an amplifier circuit to adjust the amplitude of the substitute clock signal.

In one embodiment of the present invention, the application specific ATE system illustrated in FIG. 4 is used to test one or more RDRAM devices installed on a single RIMM. Thus, RDRAM DUT 416 in FIG. 4 represents either a single discrete RDRAM device or a module populated with a plurality of RDRAM devices.

Figure 5A:
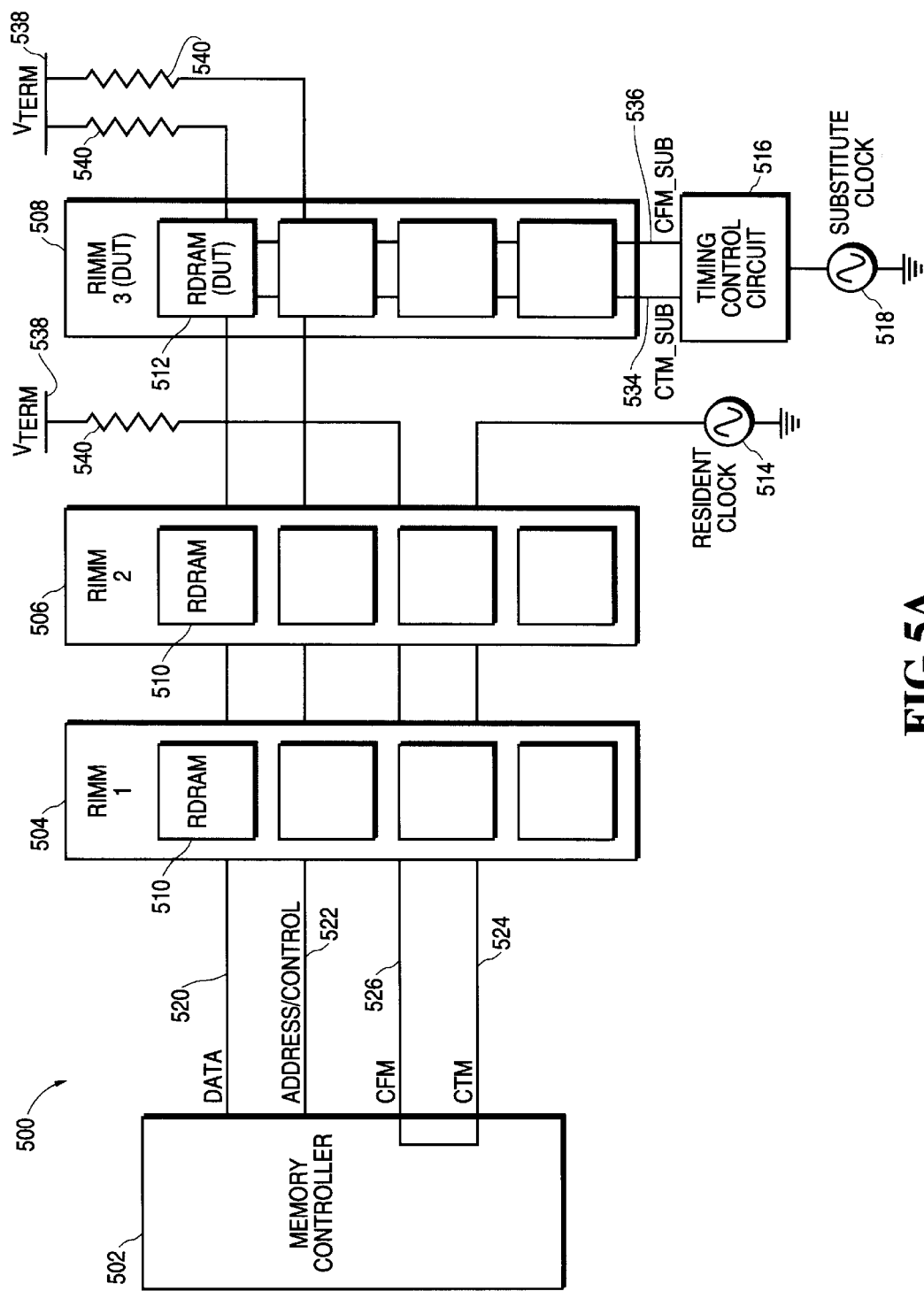
FIG. 5A illustrates a test RAMBUS in-line memory module coupled to a memory controller in an application specific automated test equipment system, according to one embodiment of the present invention.

FIG. 5A illustrates an interface between a memory controller 502 and a RIMM holding RDRAM DUTs for a single-channel RAMBUS system, according to one embodiment of the present invention. In circuit 500, memory controller 502 is coupled to three RAMBUS in-line memory modules (RIMMs). Each RIMM module 504, 506, and 508 contains four RDRAM devices, although it is to be noted that the RIMM modules may be populated with more or fewer RDRAM devices in accordance with the RAMBUS specification. Data signals are transmitted from memory controller 502 to the RIMM modules over data line 520, and address and control signals are transmitted to the RIMM modules over address/control line 522. The data and address/control signals are terminated to a termination voltage $V_{term}$ 538 through termination resistors 540. The third RIMM module 508 contains the RDRAM devices under test 512, while the first and second RIMM modules 504 and 506 are populated with known good RDRAM devices 510.

RIMM modules 504 and 506 constitute 'resident' memory, and RIMM module 508 holding the RDRAM DUTs constitutes 'test' memory. For one embodiment of the present invention, the resident memory is placed closer to the memory controller on the native interface board than the test memory. The standard CTM/CFM and data relationships for a single RAMBUS channel are kept intact through the resident memory. One or more test routines are loaded into the resident memory for execution by the ATE unit coupled to memory controller 502.

In one embodiment of the present invention, a resident clock circuit 514 provides the clock signal for the resident RIMM modules 504 and 506. The resident clock circuit 514 is typically implemented as a Direct RAMBUS Clock Generator (DRCG) to create CTM with a phase alignment required by the memory controller 502.

For the resident memory, a resident clock loop begins at the last RIMM of the resident memory and propagates to the memory controller end as ClockToMaster (CTM) 524. It then loops back from the memory controller 502 as ClockFromMaster (CFM) 526 to the resident memory RIMM modules 504 and 506, and then terminates to a termination voltage ($V_{term}$) 538 through a termination resistor 540. It should be noted that, unless otherwise indicated, throughout the following discussion CTM refers to the differential pair of signals ClockToMaster and its complement ClockToMasterN, and CFM refers to the differential pair of signals ClockFromMaster and its complement ClockFromMasterN.

For the test memory, a substitute clock circuit 518 generates a substitute clock signal. The substitute clock circuit 518 is connected to a timing control circuit 516. Timing control circuit 516 generates a substitute ClockToMaster (CTM_sub) signal 534. The CTM_sub signal 534 enters the test RIMM 508 at the end of the channel and at the point farthest from the memory controller 502. The CTM_sub signal 534 is propagated through every RDRAM 512 on the test RIMM 508. The timing control circuit 516 also generates a substitute ClockFromMaster (CFM_sub) signal 536 that is likewise propagated through every RDRAM 512 on the test RIMM 508. The CTM_sub and CFM_sub signals are appropriately terminated after propagating through the devices on test RIMM 508. Thus, as illustrated in the embodiment of FIG. 5A, two clock loops are created. The resident loop consisting of the memory controller 502 and the resident memory RIMMs 504 and 506 with CTM/CFM signals forming the resident clock domain, and the test loop consisting of the test RIMM 508 with CTM_sub/CFM_sub signals forming the test clock domain. As with the CTM/CFM signals, it is assumed that unless indicated otherwise, CTM_sub includes substitute differential pair CTM and complement CTMN signals, and CFM_sub includes substitute differential pair CFM and complement CFMN signals.

For the embodiment illustrated in FIG. 5A, the data portion of the channel (nominally consisting of RAMBUS RQ, DQA, DQB signals) is routed normally and remains independent of the resident and test clock loops. That is, the data is routed as if there were only one standard RAMBUS Direct Channel. Once CTM/CFM and CTM_sub/CFM_sub clock signals are phase aligned at a certain point on the channel, the entire memory interface 500 operates exactly like a standard channel with only one clock source. In this case, the test RIMM 508 receives a CTM_sub 534 signal that corresponds with the CTM signal 524. Likewise, when the test RIMM 508 launches data synchronously with CFM_sub 536, the data arrives at the memory controller 502 in phase with the CFM signal 526. Thus, for this embodiment, when the resident loop and substitute (test loop) clocks are phase aligned, data is transmitted from all three RIMM modules to the memory controller 502 synchronously with the CTM signal 524. Likewise, the memory controller 502 sends data to all three RIMM modules synchronously with the CFM signal 526.

For normal operation the CTM_sub signal 534 should be phase aligned with the resident memory CTM signal 524 generated by the clock circuit 514 to ensure that the clock-to-data relationship remains the same throughout the resident and test clock domains. In one embodiment of the present invention, the phase of the substitute clock signal generated by substitute clock circuit 518 and timing control circuit 516 is adjustable in relation to the resident clock signal generated by resident clock circuit 514. This allows the clock-to-data time relationship at RDRAM DUTs 512 to be altered, and provides a means for measuring the timing marginality of these devices. For this embodiment, timing control circuit 516 includes a programmable delay circuit that shifts the transition time of either the rising or falling edges of the CTM_sub 534 and CFM_sub 536 relative to CTM 524 and CFM 526, respectively.

In one embodiment of the present invention, the timing control circuit 516 also includes a calibration circuit that controls the voltage levels of signals driving the timing circuitry in the substitute clock 518 to ensure that phase differences between the resident and substitute clock signals are accurately measured. For this embodiment, timing control circuit 516 further includes an amplitude control and calibration circuit. This circuit measures and controls the amplitude of the substitute clock signal at the DUTs and compensates for any clock signal attenuation across the test RIMM 508.

It is to be noted that although the test system illustrated in FIG. 5A comprises a single-channel RAMBUS interface, the configuration of circuit 500 may be extended in alternative embodiments of the present invention to apply to two-channel and fourchannel RAMBUS interfaces in accordance with the RAMBUS specification. It is to be further noted that the number of RIMM modules and/or RDRAM devices on these modules may be varied in alternative embodiments of the present invention.

Figure 5B:
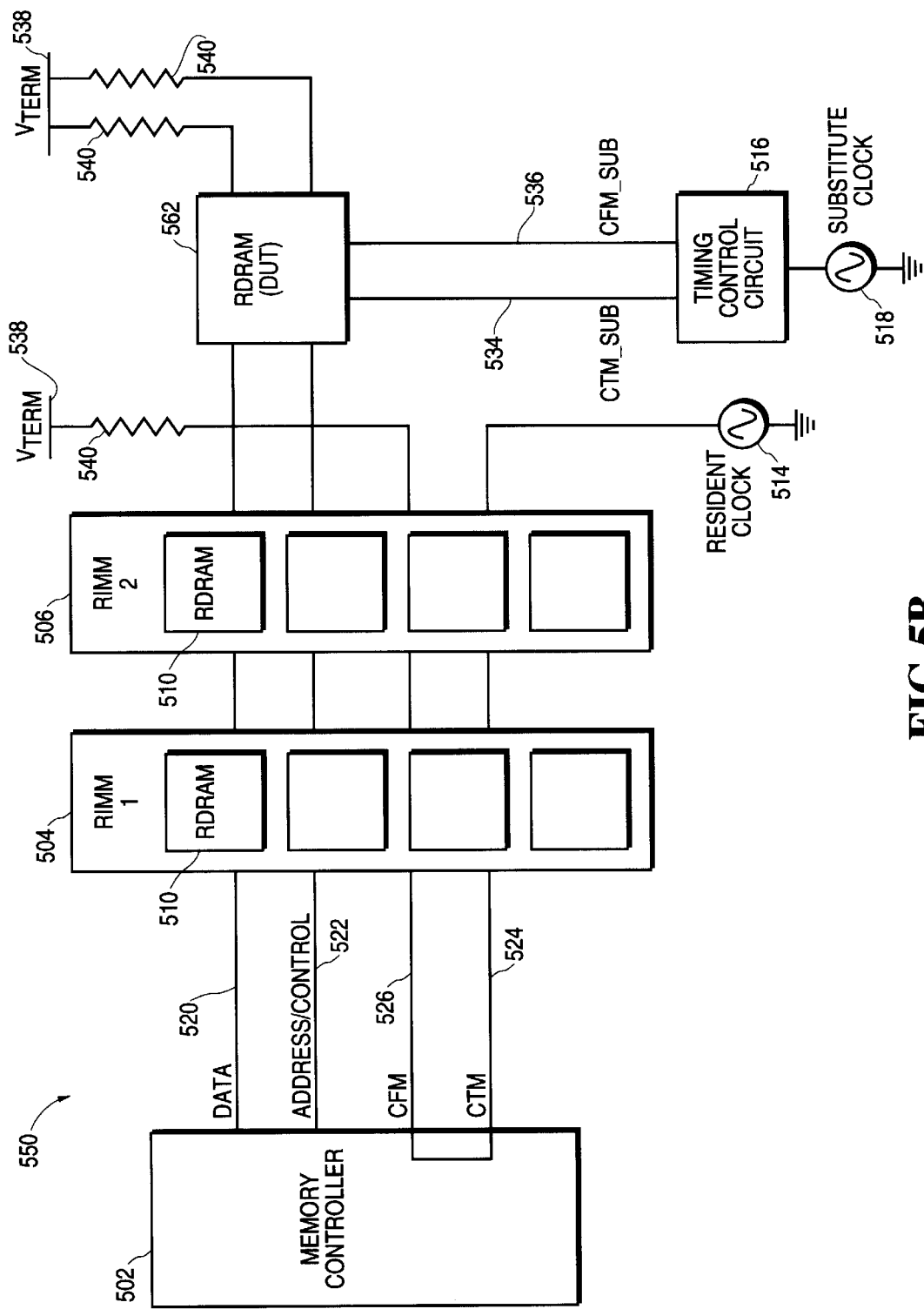
FIG. 5B illustrates a single test RAMBUS RDRAM coupled to a memory controller in an application specific automated test equipment system, according to an alternative embodiment of the present invention.

In an alternative embodiment of the present invention, the RDRAM device under test may comprise a single discrete RDRAM device instead of a module of devices. FIG. 5B illustrates an application specific ATE system for testing a single RDRAM device, according to one embodiment of the present invention. For the embodiment illustrated in FIG. 5B, the components and configuration of ATE system 550 is equivalent to that of ATE system 500 of FIG. 5A, except that test RIMM 508 is replaced by a single discrete RDRAM 562. Thus, for system 550, the data 520, address/control 522, CTM_sub signal 534, and CFM_sub signals 536 are all transmitted to RDRAM DUT 562 directly without being propagated through a RIMM module.

Figure 6:
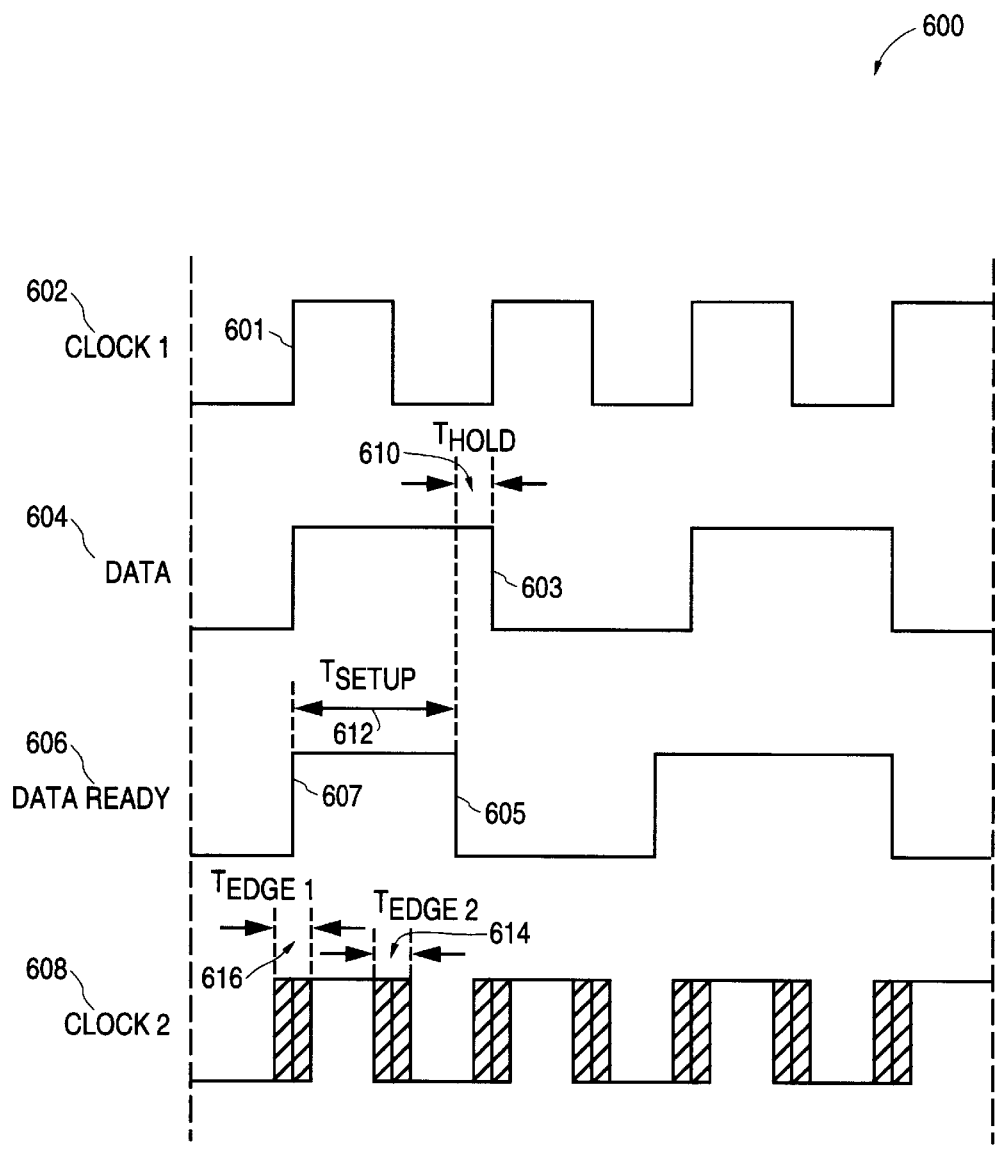
FIG. 6 is a timing diagram of a device under test showing an adjustable substitute clock signal, according to one embodiment of the present invention.

As stated above, in reference to FIG. 5A, the phase of the substitute clock signal generated by the timing control circuit is adjustable in relation to the resident clock signal. FIG. 6 is a timing diagram that illustrates simplified clock-to-data timing relationships for a DUT, according to one embodiment of the present invention. The clock 1 signal 602 corresponds to the timing signal generated by a resident clock. The data 604 and data ready 606 signals represent portions of the data and control signals transmitted by a memory controller during a test operation. For normal memory cycles, the source device causes data to launch at a time t before the clock. In FIG. 6, it is assumed that the source device causes data to be launched at a time t=625 picoseconds before the clock edge. Clock edge 601 on the clock 1 signal 602 triggers a transition in the data signal 604 corresponding to data edge 603. Because of propagation delays, there is a certain time period between the clock edge trigger 601 and the data state transition 603.

The data ready signal 606 specifies the minimum input setup time ($T_{setup}$) 612 required before the data can be latched. For example, $T_{setup}$ may be on the order of 200 picoseconds. There is also a minimum hold time ($T_{hold}$) 610 that must be maintained for the data to be valid. Thus, certain minimum $T_{setup}$ and $T_{hold}$ times must be maintained to assure that the clock edge will arrive at the destination device with the same clock to data relationship as established at the source device. If data is written to or read from a device that does not exhibit adequate $T_{setup}$ and $T_{hold}$ characteristics, the clock-to-data relationship will be invalid and the device will fail a memory test. Most devices, however, possess a margin of error across which it is possible to vary the setup and hold times and still not induce a failure.

The implementation of a substitute clock with a variable phase delay in accordance with embodiments of the present invention allows adjustment of the setup and hold times and allows a measurement of the clock-data margin that is present at the test device. The clock 2 signal 608 represents the adjustable substitute clock signal generated by a timing control module (e.g., timing control circuit 516 in FIG. 5A). In one embodiment of the present invention, the transition times of the rising and/or trailing edges of the substitute clock signal are adjustable over a certain predetermined range. For example, the transition time for the rising edges, $T_{edge1}$, of the substitute clock signal 608 may be varied across values within range 616. Likewise, the transition time for the falling edges, $T_{edge2}$, of the substitute clock signal may be varied across values within range 614.

In one embodiment of the present invention, the phase of the substitute clock signal 608 is advanced with respect to the data signal 604 such that, at the DUT, the data is arriving with an ever-decreasing setup time 612. In this case, the rising edge of the substitute clock signal 608 shifts to the right with respect to the data signal 604. This simulates the case in which $T_{dvb}$ was incorrect at the time of data launch. Eventually, the transaction will fail as incorrect data is captured because of a setup time violation at the DUT. In this manner the setup time margin for the DUT can be determined to give a measurement of the setup tolerance of the DUT. Similarly, the marginality of the hold time of the DUT can be determined by retarding the clock transition time until the transaction fails due to inadequate hold time at the input stage. In this case, the falling edge of the substitute clock signal 608 is shifted to the right with respect to the data signal 604.

Figure 7:
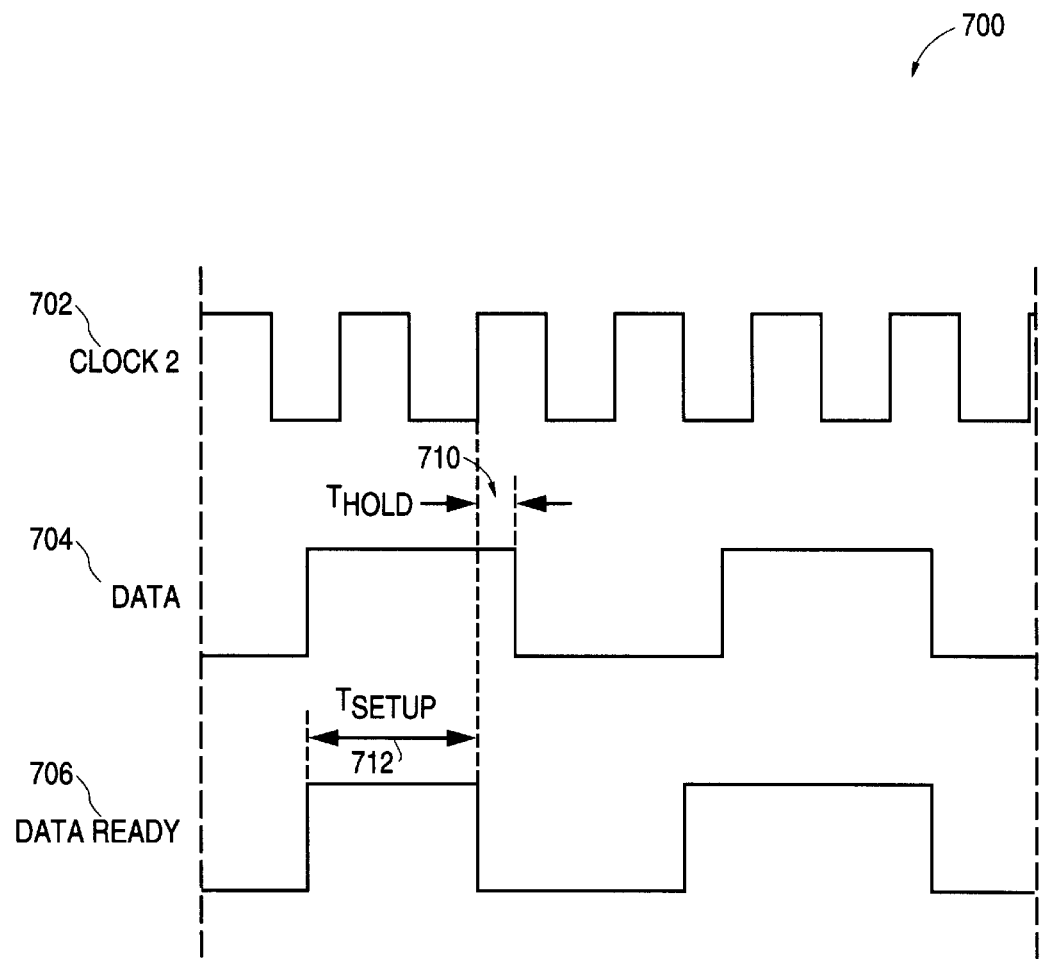
FIG. 7 is a timing diagram of a device under test with an adjustable substitute clock signal set to a particular frequency, according to one embodiment of the present invention.

FIG. 7 is a timing diagram that illustrates the adjustment of the substitute clock signal to the point in which the DUT is forced to violate minimum required setup and/or hold time requirements. The clock 2 signal 702 corresponds to the clock 2 signal 608 in FIG. 6, and represents a substitute clock signal that has been phase adjusted to the extent that its rising and falling edges are triggered at a significantly higher frequency than the resident clock signal 602 illustrated in FIG. 6. For the situation illustrated in FIG. 7, the substitute clock edges trigger too quickly to allow the data signal 704 to be latched within the setup time 712 of the data ready signal 706 and held for the minimum required hold time 710. The difference between the phase adjustment of the substitute clock signal 702 and the resident clock signal 601 at the point at which such a failure occurs represents the marginal timing error of the DUT.

In an alternative embodiment of the present invention, the amplitude of the substitute clock signal is adjustable in relation to the resident clock signal. This allows the clock amplitude-to-data relationship at the device under test to be altered. In this manner, a measurement of the margin of error with respect to clock signal strength and other electrical characteristics of the DUT can be determined.

It should be noted that the timing diagrams illustrated in FIG. 6 and 7 are simple examples of clock and data signal relationships generated while testing a device, such as a RAMBUS RDRAM, according to one embodiment of the present invention, and that certain RAMBUS specific timing characteristics, such as triggering data from both rising and falling edges of a clock are not shown to avoid unnecessarily obscuring the illustrations.

Figure 9:
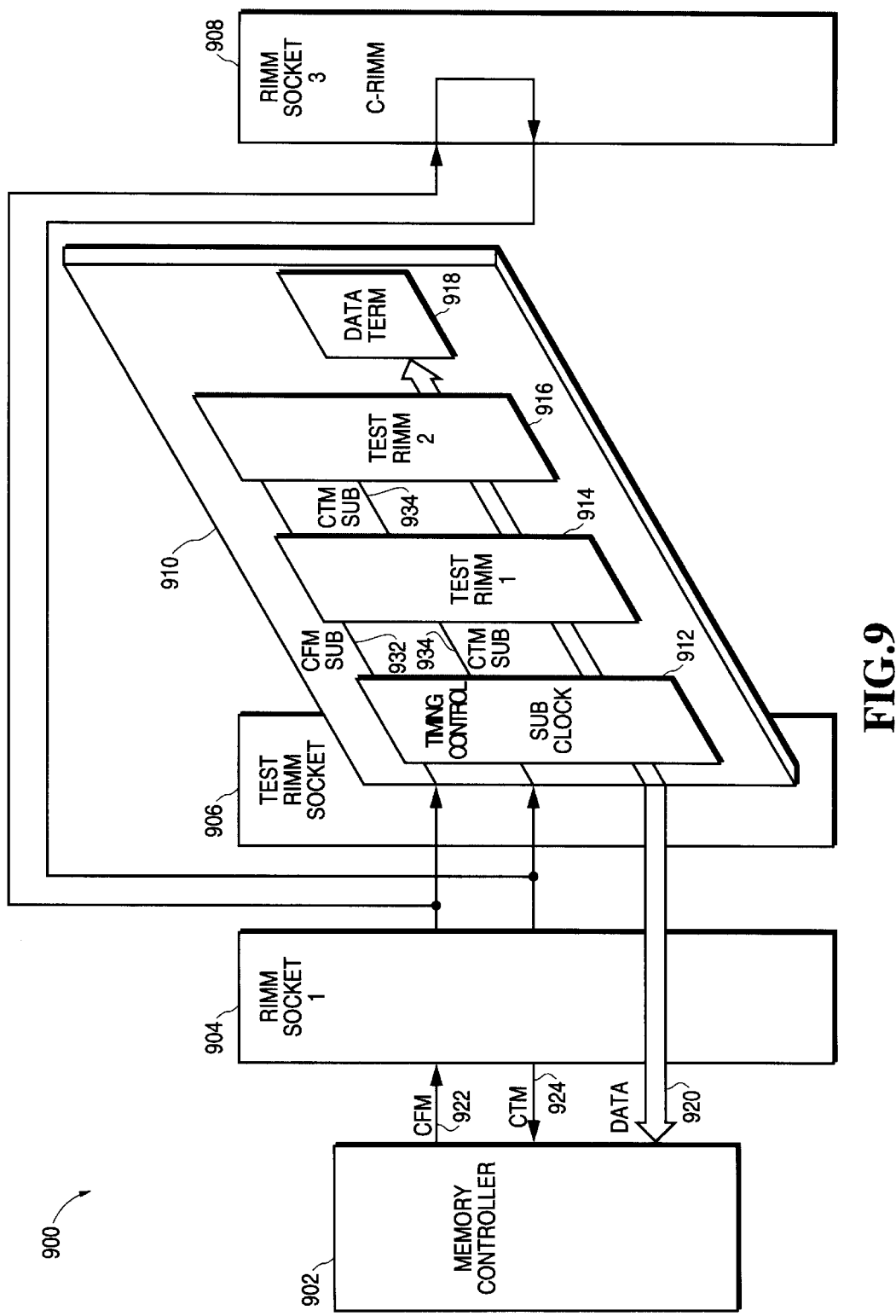
FIG. 9 illustrates the configuration of a timing riser card holding test RAMBUS memory devices, according to one embodiment of the present invention.

As illustrated in FIG. 4, an application specific ATE for one embodiment of the present invention includes a RIMM riser card that provides access to RDRAM devices under test and timing control circuitry. In one embodiment of the present invention, the RIMM riser card 410 includes a timing control module 412 that adjusts a timing characteristic of the substitute clock relative to the resident clock. For purposes of discussion, a RIMM riser card that includes an adjustable substitute clock circuit will be referred to as a "timing riser card". FIG. 9 illustrates the configuration of a timing riser card for testing RAMBUS memory devices, according to one embodiment of the present invention.

For the embodiment illustrated in FIG. 9, the RAMBUS test system 900 includes a memory controller 902 and three RIMM sockets 904, 906, and 908. The first RIMM socket 904 is populated with known good RDRAM devices. The third RIMM socket 908 is populated with a continuity module or "C-RIMM" that does not contain any RDRAM devices, but instead provides continuity and termination for various signals propagated from the other RIMM sockets. The second RIMM socket 906 is populated with a timing riser card 910.

In one embodiment of the present invention, the timing riser card 910 intercepts the standard channel signal routing beyond the first RIMM socket 904 and controls the routing from that point onward. The timing riser card 910 routes data signals 920 propagated from memory controller 902 to test RDRAM devices installed on test RIMMs 914 and 916. For the embodiment illustrated in FIG. 9, two test RIMM slots are shown. It is to be noted, however, that any number of test RIMMs up to the maximum allowable by the RAMBUS specification may be installed on the timing riser card 910. The data signals 920 are terminated on the timing riser card in data termination circuit 918, and are not routed back to the native interface board of the ATE system. For purposes of illustration, data signals 920 include RAMBUS Signaling Logic (RSL) data signals and other RAMBUS specific control signals.

For the embodiment illustrated in FIG. 9, CTM 924 and CFM 922 clock signals are routed between the memory controller 902 through the RDRAM devices in the first RIMM socket 904 and to the C-RIMM in the third RIMM socket 908. The resident CTM 924 and CFM 922 signals are also routed through a timing control circuit 912 on the timing riser card 910. Timing control circuit 912 includes a substitute clock circuit that creates substitute CTM and CFM signals, denoted CTM_sub 934 and CFM_sub 932, and propagates them through the RDRAMs on the test RIMM modules 914 and 916. The timing control circuit 912 operates to phase align the substitute CTM_sub/CFM_sub clock signals with the resident CTM/CFM clock signals.

The timing riser card substitute clock signals are inserted into the test channel and are routed in the same manner as resident clock signals are normally routed. To ensure proper clock-to-data phase relationships, the substitute clock and data lines on timing riser card 910 are maintained at equal electrical lengths. When the resident CTM/CFM clocks and the substitute CTM_sub/CFM_sub clocks are phase aligned, the substitute clock is identical to the resident clock, and the test RIMMs will function as if they were being driven by the resident clock signals.

In one embodiment of the present invention, the timing control circuit 912 on timing riser card 910 includes a programmable delay circuit that operates to adjust the clock-to-data relationship of the substitute clock relative to the clock-to-data relationship of the resident clock. In this manner, the effective phase of the CTM_sub/CFM_sub signals can be skewed relative to the CTM/CFM signals. The RDRAM setup and hold times for the test RIMMs can be stressed using the programmable delay circuit to advance and retard the CFM_sub 932 signal edges. As illustrated in FIG. 6, the RDRAM setup and hold times are stressed because the data packets were launched by memory controller 902 into the RAMBUS channel source synchronously with the resident CFM 922 timing. Since the CFM_sub 932 clock edges transition sooner or later than the resident CFM 922 clock edges, the data capture at the RDRAM will stress the setup or hold times, depending on the phase relationship of the CFM_sub 932 signal to the data signals 920.

Similarly, the programmable delay circuit is operable to advance and retard the CTM_sub 934 signal edges. This allows the CTM_sub clock edges to be advanced and retarded so that data will be launched from the RDRAM devices early or late with respect to the resident CTM 924 signal that is propagated to the memory controller 902 and first RIMM socket 904.

In one embodiment of the present invention, the RAMBUS test system 900 of FIG. 9 is used in an application specific ATE system, such as system 350 illustrated in FIG. 3B. RAMBUS test system 900 represents a portion of the native environment interface board 320 used to test RDRAMs on test RIMMs 914 and 916. For this embodiment, one or more test programs is loaded into RDRAMs inserted into RIMM socket 904. Execution of the test programs is controlled by application specific ATE unit 340.

The embodiment of the present invention shown in FIG. 9 illustrated a timing control circuit and test RIMMs installed on a timing riser card. However, in an alternative embodiment of the present invention, the timing control circuit and test RIMMs are placed on the native interface board itself, for example, between the first and third RIMM sockets. For this embodiment, the first and third RIMM sockets are separated by a distance that does not break the RAMBUS signal timings, but that accommodates the placement of the timing control circuit and test devices between them.

The RAMBUS test system illustrated in FIG. 9 creates two independent RAMBUS clock loops. The resident loop consists of the CTM/CFM clock loop generated by a RAMBUS clock generator (not shown), memory controller 902, the RDRAMs in the first RIMM socket 904, and the C-RIMM in the third RIMM socket 908. The test loop consists of the CTM_sub/CFM_sub clock loop generated by the substitute clock circuit 912 and propagated through the test RIMMs 914 and 916 on timing riser card 910. The resident and test clock loops are maintained independently so that transactions between the first RIMM socket 904 and the memory controller 902 are not affected by the test clock loop that drives the test RIMMs. This independent operation ensures that a test program residing completely in the memory space of the first RIMM socket 904 will not be corrupted when the timing of the test loop is stressed.

Figure 8:
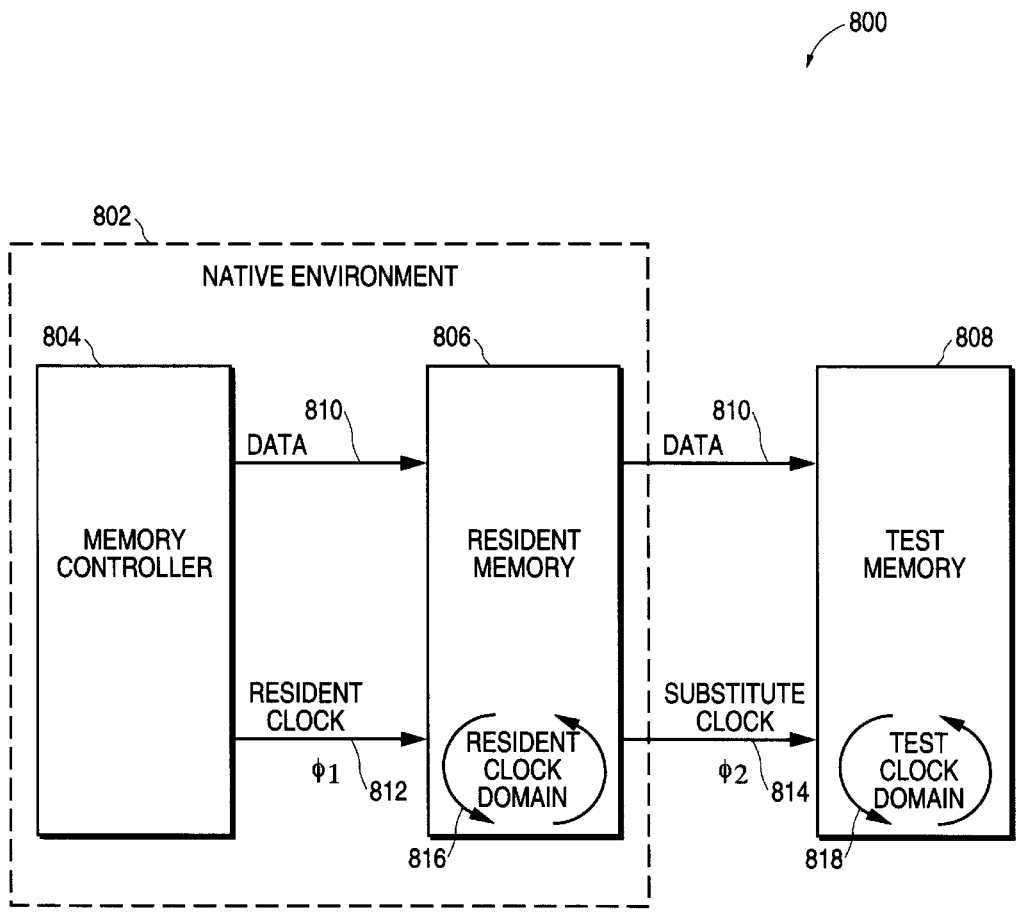
FIG. 8 is a block diagram illustrating resident memory and test memory clock domains for an application specific automated test equipment system, according to one embodiment of the present invention.

FIG. 8 is a block diagram illustrating the general configuration of the resident memory and test memory clock domains created by the RAMBUS test system illustrated in FIG. 9, according to one embodiment of the present invention. Resident memory 806 is coupled to memory controller 804, and these two components comprise a portion of the native environment 802 of the application specific ATE system that executes test programs to test memory 808. Test data 810 is transmitted from memory controller 804 to test memory 808. A resident clock signal 812 is transmitted from memory controller 804 to resident memory 806 to form the resident clock domain 816. A substitute clock signal 814 is transmitted to test memory 808 to form the test clock domain 818. The phase of resident clock signal 812 is denoted $\varnothing_1$ and the phase of substitute clock signal 814 is denoted $\varnothing_2$. For normal RAMBUS operation, the phases of the resident clock 812 and substitute clock 814 signals must be aligned with one another, as well as with the data. In one embodiment of the present invention, the substitute clock phase, $\varnothing_2$, 814 is adjusted relative to the resident clock phase, $\varnothing^1$, 812 to determine the margin of error for the input and output timing characteristics of test memory 808.

Figure 10:
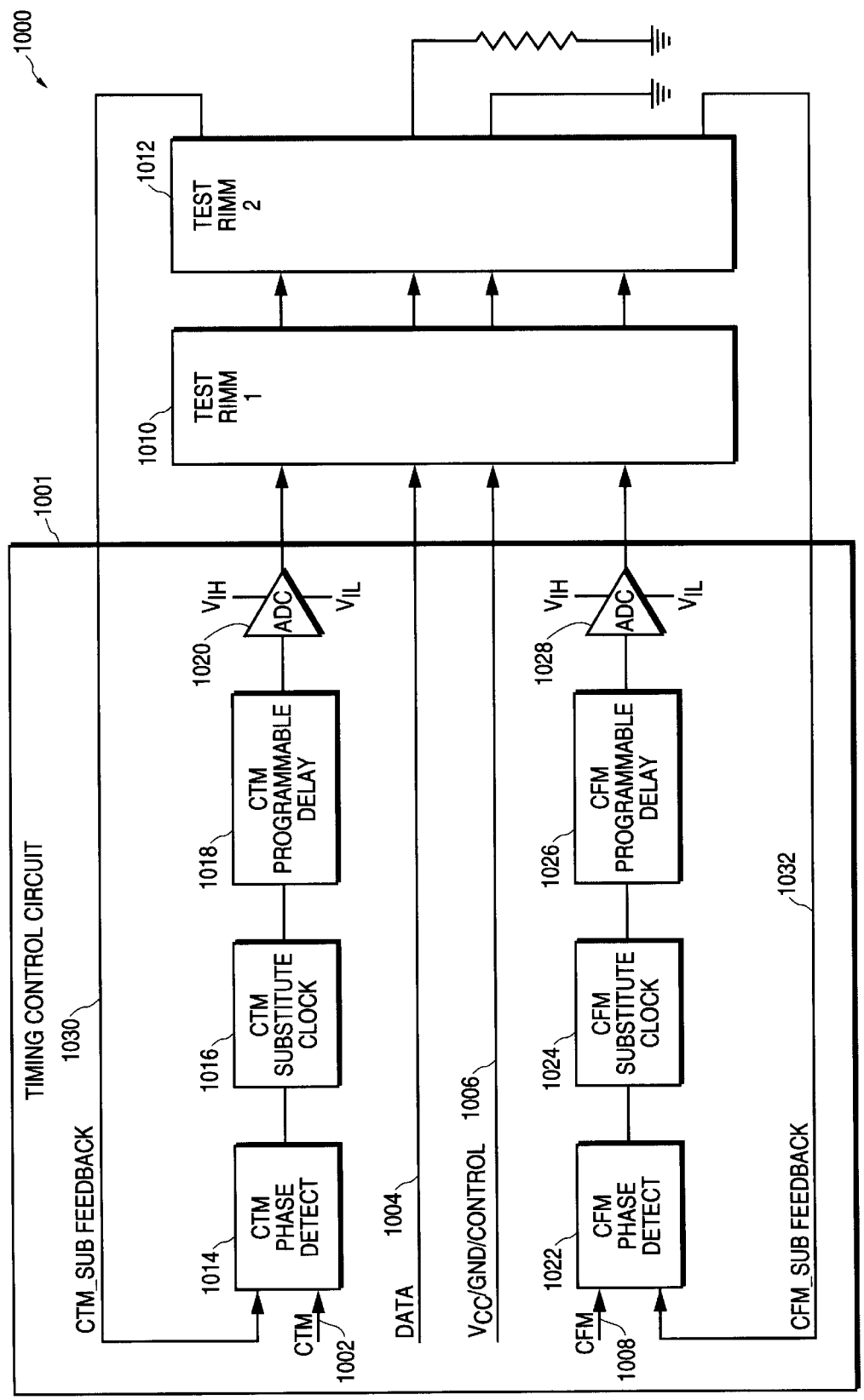
FIG. 10 is a block diagram illustrating components within the timing riser card illustrated in FIG. 9, according to one embodiment of the present invention.

FIG. 10 is a block diagram that illustrates in greater detail the composition of timing riser card 910 of FIG. 9, according to one embodiment of the present invention. The resident CTM signal 1002 (corresponding to CTM 924 in FIG. 9) is input to CTM phase detection circuit 1014. The CTM phase detection circuit 1014 includes a differential comparator that senses the CTM crossover time. The comparator output is an emitter coupled logic (ECL) differential pair and the differential output of this circuit is transmitted to the input of CTM substitute clock circuit 1016. In one embodiment of the present invention, the CTM substitute clock circuit is implemented as a quad driver chip that includes a phase locked loop (PLL) circuit. One output of the quad driver chip generates the substitute CTM clock signal (CTM_sub), and the other output generates the substitute CTMN (CTMN_sub) signal. If necessary, one or more impedance matching resistors is inserted in the CTM_sub clock path to match the output and input impedance of the driver and phase detect circuits.

Together, the CTM_sub and CTMN_sub signals constitute the CTM_sub signal. This differential pair drives the input of a CTM programmable delay circuit 1018. The CTM_sub signal enters the test RIMMs 1010 and 1012 at the point farthest from the memory controller, just as the normal CTM routing would. When the one or more test RIMMs are installed, the CTM_sub signal is routed across these test RIMMs and propagated back to the test channel at the controller side of the timing riser card.

The CTM_sub signal is also fed back (as CTM_sub feedback signal 1030) to the CTM phase detection circuit 1014. The CTM_sub signal is thus sensed at the identical point that the resident CTM signal 1002 is sensed. In one embodiment, CTM phase detect circuit 1014 includes two comparators, one for CTM signal 1002 and one for CTM_sub feedback signal 1030. One output from each comparator is sent to the input of an exclusive-OR (XOR) circuit that implements the phase detector. When the two input clock signals are in-phase, the XOR output will be a logic high. Any point other than an in-phase state will generate a high pulse whose width corresponds to a phase error between the CTM clock signal 1002 and the CTM_sub feedback signal 1030.

In one embodiment of the present invention, the output of the CTM programmable delay circuit 1018 is sent through a low pass filter, such that the DC voltage at the filter output represents the phase error between the resident CTM 1002 and CTM_sub feedback 1030 clock signals. This signal is amplified and transmitted to an analog-to-digital converter (ADC) 1020. The digital value generated by ADC 1020 indicates the magnitude of the phase error between the CTM 1002 and CTM_sub 1030 signals. Using the CTM programmable delay circuit 1018, the delay time (phase difference) between these two signals is adjusted, and the output value from ADC 1020 is determined. In one embodiment of the present invention, this process is repeated iteratively until a minimum value is determined. This minimum value corresponds to the point where the two clocks, CTM and CTM_sub are in-phase. Voltage input high (VIH) and voltage input low (VIL) signals are input to ADC 1020 to set the low and high threshold voltage levels to define the range of voltage skew for adjusting the delay value in CTM programmable delay 1018.

For the embodiment illustrated in FIG. 10, generation of the substitute CFM signal (CFM_sub) 1032 is accomplished similarly to that described above for the CTM_sub signal. The resident CFM signal 1008 (corresponding to CFM 922 in FIG. 9) is input to CFM phase detection circuit 1022. The output from CFM phase detection circuit 1022 is input to CFM substitute clock circuit 1024. In one embodiment of the present invention, the CFM substitute clock circuit is a quad driver chip that includes a phase locked loop (PLL circuit). The CFM substitute clock circuit generates both a substitute CFM and a substitute CFMN signal as a differential pair. The output from CFM substitute clock circuit 1024 is input to a CFM programmable delay circuit 1026. From CFM programmable delay circuit 1026, the CFM_sub signal is input to the test RIMMs through an analog-to-digital converter 1028. The CFM_sub signal 1032 is propagated to test RIMMs 1010 and 1012 and fed back as CFM_sub feedback signal 1032 to CFM phase detection circuit 1022. Comparison and adjustment of the relative phase of CFM 1008 and CFM_sub feedback 1032 is performed in a similar manner to that described above for the CTM 1002 and CTM_sub feedback 1030 signals.

In one embodiment of the present invention, timing riser card circuit 1000 of FIG. 10 represents a detailed embodiment of timing riser card 910 of FIG. 9. Data signals 1004 are transmitted from the memory controller up through the timing riser card circuit 1000 and propagated through the test RIMM modules 1010 and 1012 and terminated on the timing riser card. Likewise, RAMBUS standard power ($V_{cc}$), ground, and control lines are transmitted through the timing riser card circuit 1000, propagated through the test RIMM modules and suitably terminated on the timing riser card.

It is to be noted that, in general, proper selection of the phase detection points is critical to proper operation of the timing riser card circuit 1000. Thus, clock phase and alignment must be correct and accurate. In general, the VIH and VIL levels input to the CTM substitute clock 1016 and CFM substitute clock 1024 circuits must be calibrated to achieve the best accuracy. The analog-to-digital controllers used for phase detection require only relative voltage measurements, but VIH/VIL absolute magnitudes must be known. In one embodiment of the present invention a +/−10 volt reference chip is used to calibrate the ADC. Once calibrated, the ADC is used to measure system voltages.

In one embodiment of the present invention, a dual OR/NOR gate is used to take the single ECL differential pair from the programmable delay lines 1018 and 1026, and convert them into two complementary differential pairs. Timing control is performed on each differential pair and not separately on a clock signal and its complement (e.g., CTM_sub and CTMN_sub). In an alternative embodiment of the present invention, timing control is performed individually on each substitute clock circuit and its complementary signal. Thus, for this alternative embodiment, phase relative to CTM can be adjusted independently for CTM_sub and CTMN_sub, and phase relative to CFM can be adjusted independently for CFM_sub and CFMN_sub.

In a further alternative embodiment of the present invention, the PLL based substitute clock circuits 1016 and 1024 include a circuit that can force static DC voltage levels. Greater DC accuracy is generally permitted at calibration time without adversely impacting the AC performance.

Beside input and output timing characteristics, clock attenuation across a RIMM in a RAMBUS system is also often an important parameter to determine. In one embodiment of the present invention, clock amplitude is measured at the input and output of each test RIMM. The amount of attenuation across each test RIMM is then determined. The amplitude detection circuitry consists of a pseudo-differential comparator circuit where the comparator trip point is determined by a digital-to-analog converter (DAC). The comparator output is connected to the asynchronous 'set' input of a SET-RESET (SR) flip-flop. The 'reset' input is memory mapped to a bit field controlled by system software.

In one embodiment of the present invention, the clock amplitude is determined by the first setting the reference voltage to a maximum level, e.g., 5 volts. The reset signal is then asserted and de-asserted, and the state of the SR flip-flop is set to a logic low. Since the clock will never cross the comparator threshold, the SR flip-flop remains in the reset state. The output of the SR flip-flop is monitored by the system software. The voltage reference is then lowered, and the output of the SR flip-flop is polled until the SR output changes state to become set. The output will be set as soon as the comparator has enough overdrive at the input, and the output pulse is of a sufficient width to set the SR flip-flop.

The operation of the timing riser card circuit 1000 will further be described by way of a specific timing example in which it is assumed that the time from in-phase to 180 degrees out of phase between the resident and substitute clock signals is 1.25 picoseconds. For this example, it is further assumed that the programmable delay circuits 1018 and 1026 have a resolution of 20 picoseconds. For this case, there are 62.5 steps from in-phase to 180 degrees out of phase. If input voltage of the ADC circuits 1020 and 1028 produce an approximately 18 volt swing, then there will be 290 mV per step, since there are 62 time delay steps from in-phase to 180 degrees out of phase. This resolution can be accomplished by an eight bit analog-to-digital converter.

In an alternative embodiment of the present invention, programmable delay circuits 1018 and 1026 with a resolution of 2.5 picoseconds of resolution are used. This embodiment yields 500 delay steps in 1.25 ns. For an 18 volt voltage swing, there would be 36 mV per step, which requires at least a nine bit analog-to-digital converter. If a 12-bit analog-to-digital converter is used, the excess resolution of the can be used to assess the amount of deviation present at each measurement point.

In one embodiment of the present invention, the interface between the timing riser card 910 and the ATE unit that executes the system software is implemented through a PCI DATA I/O card mapped as 16 bits of data, 4 bits of address, and write and read pins. The connector on the timing riser card and the PCI slot card are 37 pin male connectors. For this embodiment a 37 pin cable is used to connect the slot card to the timing riser card.

In one embodiment of the present invention, timing control circuit 1001 in FIG. 10 is implemented in the form of discrete components installed on a PCB that is mounted on the timing riser card 910. In an alternative embodiment of the present invention, timing control circuit 1001 is implemented in an Application Specific Integrated Circuit (ASIC), or similar programmable logic device or combination of programmable logic devices.

Figure 11:
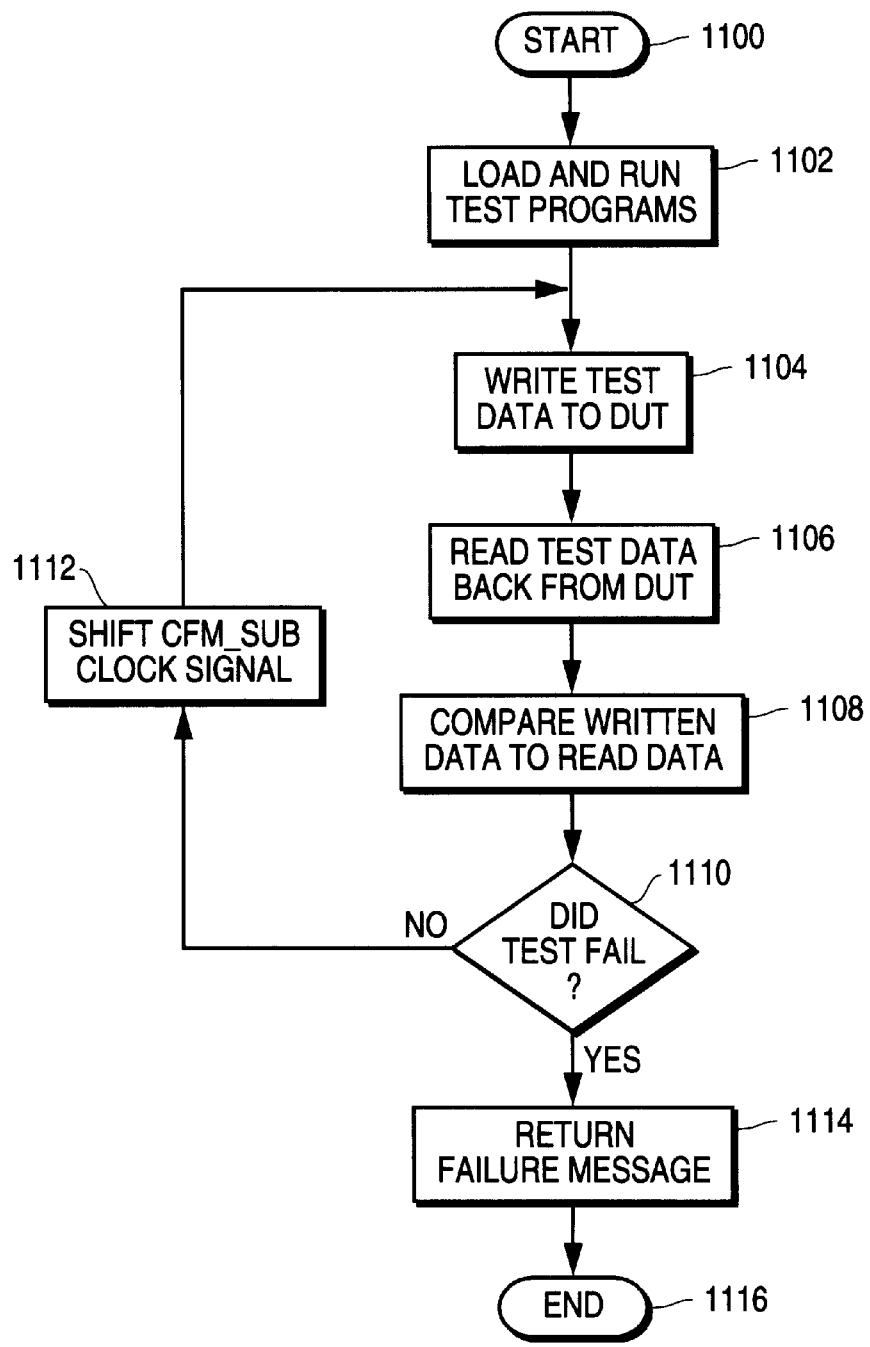
FIG. 11 is a flowchart that illustrates the steps of performing automated testing of input timing characteristics of a RAMBUS device under test, according to one embodiment of the present invention.

FIG. 11 is a flowchart that illustrates the steps of performing a test of input timings of a RAMBUS memory device, according to one embodiment of the present invention. The embodiment described in FIG. 11 is discussed with reference to the application specific ATE system illustrated in FIGS. 2 and 5A. In step 1102, the application specific ATE unit 202 boots an operating system and loads one or more test routines into the resident RIMM memory space on the riser card holding the RAMBUS devices to be tested. An RDRAM memory test program is loaded and executed. This test program causes memory transactions (e.g., read and write operations) to occur to memory address space that exists physically in the test RIMM domain. In step 1104, write operations to the test memory cause data to be stored in the test RDRAM. The data is then read back from the test memory in step 1106. In step 1108, the data read in step 1106 is compared to the data written in step 1104 to determine a pass/fail result. In step 1110, it is determined whether the test passed or failed.

If, in step 1110, it is determined that the test failed, a failure message is returned and displayed on control computer 204 to alert the user. If, however, in step 1110, it is determined that the memory test passed, the CFM_sub clock signal 536 is advanced or retarded to change its phase with respect to the CFM signal 526, step 1112. This phase shift process changes the effective hold and setup times, respectively, for the test RDRAM. The test process then repeats from step 1104 with new test data written to the test RDRAM and tested. During a normal test operation, data is iteratively written and tested for various phase shifted versions of the CFM_sub clock signal until the test RDRAM fails the memory test.

Because the CFM_sub clock signal is always aligned with the resident CFM, data output from the test RDRAM will be at nominal timing. Therefore, any failure indicates that the input data timing must have been incorrect. Note that the time-to-receipt (TTR) will be stressed using this technique. It should be noted that certain RAMBUS specific features (such as the autoskip feature) may cause data to change at some point based on the CTM_sub/CFM_sub relationship. Such features must be accounted for when analyzing the test results.

It is to be noted that the request packet destined for memory located on the test RIMM will traverse though resident memory space with the proper packet-to-CFM relationship. This allows it to not be misinterpreted as an access to resident memory which would corrupt the test program itself or the operating system code residing therein.

Figure 12:
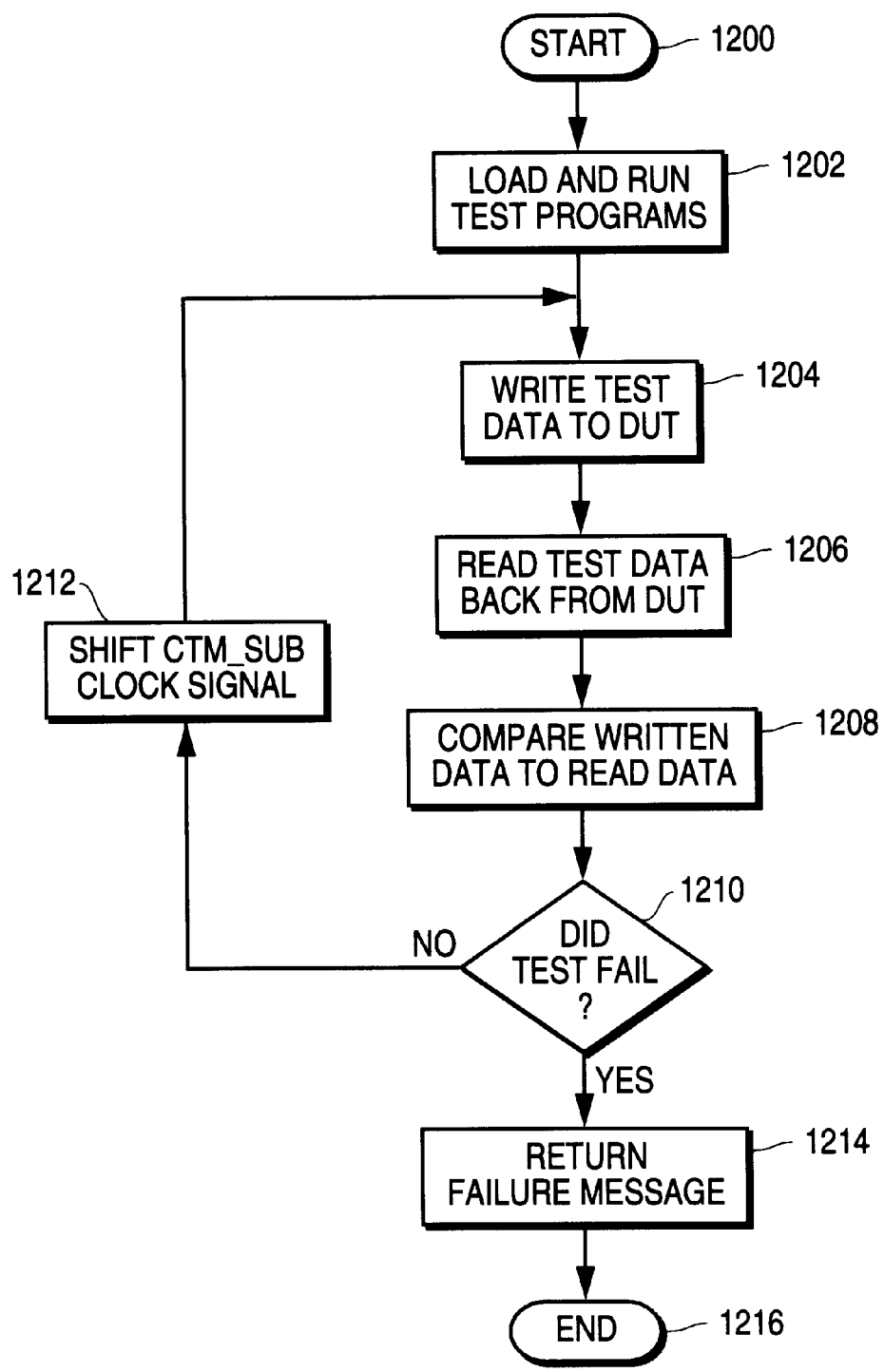
FIG. 12 is a flowchart that illustrates the steps of performing automated testing of output timing characteristics of a RAMBUS device under test, according to one embodiment of the present invention.

The application specific ATE system according to embodiments of the present invention can also be used to test output timings of RAMBUS RDRAM devices. FIG. 12 is a flowchart that illustrates the steps of performing a test of output timings of a RAMBUS memory device, according to one embodiment of the present invention. As with FIG. 11, the embodiment described in FIG. 12 is discussed with reference to the application specific ATE system illustrated in FIGS. 2 and 5A. In step 1202, the application specific ATE unit 202 boots an operating system and loads one or more test routines into the resident RIMM memory space on the riser card holding the RAMBUS devices to be tested. An RDRAM memory test program is loaded and executed. This test program causes memory transactions (e.g., read and write operations) to occur to memory address space that exists physically in the test RIMM domain. In step 1204, write operations to the test memory cause data to be stored in the test RDRAM. The data is then read back from the test memory in step 1206. In step 1208 data read in step 1206 is compared to the data written in step 1204 to determine a pass/fail result. In step 1210, it is determined whether the test passed or failed.

If, in step 1210, it is determined that the test failed, a failure message is returned and displayed on control computer 204 to alert the user. If, however, in step 1210, it is determined that the memory test passed, the CTM_sub clock signal 534 is advanced or retarded to change its phase with respect to the CTM signal 524, step 1212. This phase shift process changes the phase relationship of the data lines to CTM as it appears at memory controller 502. The test process then repeats from step 1204 with new test data written to the test RDRAM and tested. During a normal test operation, data is iteratively written and tested for various phase shifted versions of the CTM_sub clock signal until the test RDRAM fails the memory test. Any failure indicates that the read data was incorrectly captured by the memory controller 502 due to a violation of the setup or hold times of the test RDRAM.

Although the embodiments of the present invention were illustrated and discussed with specific reference to testing RAMBUS memory devices, it should be noted that application specific ATE systems and native interface boards designed in accord with alternative embodiments of the present invention can be implemented to test other types of IC devices. Such devices can include alternative types of source synchronous interface memories, such as Synclink DRAMs.

In the foregoing, an application specific ATE system for use with source synchronous bus interface devices has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus for testing an integrated circuit device in its native environment, the apparatus comprising:
   a test device;
   one or more native devices coupled to the test device, the one or more native devices selected and configured to recreate a native operating environment of the test device;
   a first clock circuit coupled to the one or more native devices and generating a first clock signal transmitted to the one or more native devices; and
   a second clock circuit comprising a timing control circuit coupled to the test device and generating a second clock signal transmitted to the test device, wherein the second clock signal is derived from the first clock signal, and wherein the timing control circuit comprises an amplitude adjustment circuit that is operable to adjust the amplitude of the second clock signal relative to the amplitude of the first clock signal.

2. The apparatus of claim 1 wherein the one or more native devices are installed on an interface board coupled between the test device and an automated test equipment system, and wherein the native environment corresponds to an electrical and functional environment of the test device when the test device is used under normal operating conditions.

3. The apparatus of claim 2 further comprising a memory coupled to the interface board, the memory operable to store one or more test programs executable by the automated test equipment system to perform functional tests on the test device while the test device is operating functionally and electrically with the one or more native devices.

4. The apparatus of claim 3 wherein the one or more test programs includes a program to adjust a characteristic of the second clock signal relative to a corresponding characteristic of the first clock signal and to perform the functional tests on the test device while the characteristic is adjusted over a range of values.

5. The apparatus of claim 4 wherein one or more characteristics of the second clock signal is adjustable in relation to a corresponding characteristic of the first clock signal.

6. The apparatus of claim 4 wherein the timing control circuit comprises a time adjustment circuit that is operable to adjust a timing characteristic of the second clock signal relative to a corresponding timing characteristic of the first clock signal.

7. The apparatus of claim 6 wherein the time adjustment circuit includes a delay circuit that is configured to shift the phase of the second clock signal relative to the phase of the first clock signal.

8. The apparatus of claim 1 wherein the second clock circuit is placed in close proximity to the test device such that clock skew and clock signal degradation effects at the test device are minimized.

9. The apparatus of claim 8 wherein the test device comprises a source synchronous bus interface device.

10. A system comprising:
    an automated test equipment unit; and
    an interface board coupled to the automated test equipment unit, the interface board comprising:
        a test device interface,
        one or more native devices coupled to the test device interface, the one or more native devices selected and configured to recreate a native electrical and functional environment of a test device coupled to the test device interface,
        a first clock circuit generating a first clock signal transmitted to the one or more native interface devices, and
        a second clock circuit comprising a timing control circuit generating a second clock signal transmitted to the test device coupled to the test device interface, wherein the second clock signal is derived from the first clock signal, and wherein the timing control circuit includes an amplifier circuit operable to shift an amplitude characteristic of the second clock signal relative to a corresponding amplitude characteristic of the first clock signal.

11. The system of claim 10 further comprising a memory coupled to the interface board, the memory operable to store one or more test programs executable by the automated test equipment unit to perform functional tests on the test device while the test device is operating functionally and electrically with the one or more native devices.

12. The system of claim 11 wherein the one or more test programs includes a program to adjust a characteristic of the second clock signal relative to a corresponding characteristic of the first clock signal and to perform the functional tests on the test device while the characteristic is adjusted over a range of values.

13. The system of claim 12 wherein the one or more test programs are operable to write and read data to and from the test device and compare data written to the test device to data read from the test device.

14. The system of claim 13 wherein the one or more test programs comprise a test process, and wherein the test process is iteratively executed by successive read, write, and compare operations, each successive read, write, and compare operation followed by an incremental adjustment of a characteristic of the second clock signal propagated to the test device.

15. The system of claim 14 wherein the test process is conducted until the test device fails a test conducted by the one or more test programs, and wherein the number of iterative read, write, and compare operations is used to determine a margin of error for the test device in relation to a corresponding characteristic of the second clock signal.

16. The system of claim 13 further comprising a user computer coupled to the automated test unit, the user computer comprising a user interface receiving data input from a user and displaying information processed by the automated test unit.

17. The system of claim 16 wherein the timing control circuit includes a delay circuit operable to shift a timing characteristic of the second clock signal relative to the first clock signal.

18. The system of claim 17 wherein the test device comprises a source synchronous bus interface device.

19. The system of claim 18 wherein the timing characteristic comprises a phase of the second clock signal relative to a phase of the first clock signal.

20. An apparatus for testing an integrated circuit device comprising:

means for interfacing the integrated circuit device to an automated test equipment system, wherein the interface means includes one or more native devices selected and configured recreate a native operating environment of the integrated circuit device;

means for propagating a first clock signal to the one or more native devices;

means for deriving a second clock signal from the first clock signal and propagating the second clock signal to the integrated circuit device;

means for writing input data to the integrated circuit device;

means for reading output data from the integrated circuit device;

means for determining whether the output data matches the input data in accordance with predetermined criteria; and means for changing a timing characteristic and an amplitude characteristic of the second clock signal relative to respective and corresponding timing and amplitude characteristics of the first clock signal until the output data fails to meet the predetermined criteria with respect to the input data.

21. A method of testing an integrated circuit device comprising the steps of:

providing an interface board to couple the integrated circuit device to an automated test equipment system, wherein the interface board includes one or more native devices selected and configured recreate a native operating environment of the integrated circuit device;

propagating a first clock signal to the one or more native devices on the interface board;

propagating a second clock signal to the integrated circuit device;

writing input data to the integrated circuit device;

reading output data from the integrated circuit device;

determining whether the output data matches the input data in accordance with predetermined criteria;

changing a timing characteristic of the second clock signal until the output data fails to meet the predetermined criteria with respect to the input data; and deriving the second clock signal from the first clock signal prior to the step of propagating the second clock signal to the integrated circuit device, and wherein an amplitude characteristic of the second clock signal is adjusted with respect to a corresponding amplitude characteristic of the first clock signal.

22. The method of claim 21 further comprising the step of deriving the second clock signal from the first clock signal prior to the step of propagating the second clock signal to the integrated circuit device, and wherein the timing characteristic of the second clock signal is adjusted with respect to a corresponding timing characteristic of the first clock signal.

23. The method of claim 22 further comprising the step of iteratively reading, writing, and comparing data written to and read from the integrated circuit device until the integrated circuit device fails a memory test, and wherein the timing characteristic of the second clock is incrementally adjusted after each compare operation.

24. The method of claim 23 further comprising the step of using the number of iteratively performed reading, writing, and comparing operations to determine a margin of error for the integrated circuit device with respect to the timing characteristic.

25. The method of claim 24 wherein the integrated circuit device comprises a source synchronous bus interface device.

* * * * *